US012804958B2

(12) United States Patent
Vedula et al.

(10) Patent No.: US 12,804,958 B2
(45) Date of Patent: Nov. 17, 2026

(54) ENHANCED BODY TIED TO SOURCE LOW NOISE AMPLIFIER DEVICE

(71) Applicant: QUALCOMM Incorporated, San Diego, CA (US)

(72) Inventors: Ravi Pramod Kumar Vedula, San Diego, CA (US); Abhijeet Paul, San Diego, CA (US); Hyunchul Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 503 days.

(21) Appl. No.: 18/455,500

(22) Filed: Aug. 24, 2023

(65) Prior Publication Data

US 2025/0072059 A1 Feb. 27, 2025

(51) Int. Cl.

*H10D 30/69* (2025.01)
*H10D 30/01* (2025.01)
*H10D 30/60* (2025.01)
*H10D 62/13* (2025.01)
*H10D 64/23* (2025.01)
*H10D 64/27* (2025.01)
*H03F 3/195* (2006.01)

(52) U.S. Cl.

CPC ......... *H10D 30/711* (2025.01); *H10D 30/027* (2025.01); *H10D 30/605* (2025.01); *H10D 62/151* (2025.01); *H10D 64/251* (2025.01); *H10D 64/519* (2025.01); *H03F 3/195* (2013.01); *H03F 2200/294* (2013.01); *H03F 2200/451* (2013.01)

(58) Field of Classification Search

CPC ............. H10D 30/711; H10D 30/6708; H10D 30/6711

See application file for complete search history.

(56) References Cited

U.S. PATENT DOCUMENTS 5,811,855 A * 9/1998 Tyson ................ H10D 30/6711 257/349
5,821,575 A 10/1998 Mistry et al.
(Continued)

FOREIGN PATENT DOCUMENTS

EP 0497216 A2 8/1992

OTHER PUBLICATIONS

International Search Report and Written Opinion—PCT/US2024/036595—ISA/EPO—Sep. 24, 2024.

*Primary Examiner* — Leonard Chang
*Assistant Examiner* — Dzung T Hoang
(74) *Attorney, Agent, or Firm* — QUALCOMM Incorporated

(57) ABSTRACT

A radio frequency (RF) device is described. The RF device includes a semiconductor-on-insulator (SOI) substrate having a first-type diffusion region. The RF device also includes a transistor including a source region and a drain region in the first-type diffusion region, a gate region between the source region and the drain region, and a body region. The RF device further includes a second-type diffusion region, comprising a gate overlap region partially overlapped by the gate region to define the body region and a second-type diffusion encroachment region in the source region and adjoining the gate overlap region to form a body terminal region, in which a silicidation layer shorts the body terminal region to the source region.

18 Claims, 17 Drawing Sheets

(56) References Cited

U.S. PATENT DOCUMENTS

| | | | | |
|---|---|---|---|---|
| 2002/0096719 | A1* | 7/2002 | Dockerty | G06Q 40/02 257/E29.147 |
| 2002/0105014 | A1* | 8/2002 | Houston | H10D 30/0323 257/E21.415 |
| 2003/0222308 | A1 | 12/2003 | Su et al. | |
| 2009/0065866 | A1 | 3/2009 | Larsen et al. | |
| 2012/0012931 | A1* | 1/2012 | Chen | H10D 30/6711 257/E29.268 |
| 2016/0126906 | A1 | 5/2016 | Maxim et al. | |
| 2018/0308862 | A1 | 10/2018 | Crandall | |
| 2019/0348514 | A1 | 11/2019 | Ellis-Monaghan | |
| 2020/0357886 | A1* | 11/2020 | Shi | H10D 30/6711 |
| 2021/0305279 | A1 | 9/2021 | Willard | |
| 2022/0293790 | A1 | 9/2022 | Calvo et al. | |
| 2022/0320343 | A1* | 10/2022 | Tseng | H10D 30/6711 |
| 2023/0128170 | A1 | 4/2023 | Avci et al. | |
| 2024/0421227 | A1* | 12/2024 | Brindle | H03K 17/162 |

* cited by examiner

ENHANCED BODY TIED TO SOURCE LOW NOISE AMPLIFIER DEVICE

TECHNICAL FIELD

The present disclosure relates to integrated circuits (ICs). More specifically, the present disclosure relates to an enhanced body tied to source low noise amplifier (LNA) device.

BACKGROUND

The design complexity of mobile radio frequency (RF) chips (e.g., mobile RF transceivers) is complicated by added circuit functions for supporting communications enhancements. Designing mobile RF transceivers may include using semiconductor-on-insulator (SOI) technology. SOI technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance low noise amplifiers (LNAs) are currently manufactured using SOI substrates. Additionally, traditional floating body (FB) LNAs exhibit great RF-SOI performance, but suffer from a floating body effect, in which the transistor's body collects a charge generated at the junctions of the transistor device. As described, this floating body effect is referred to as a kink effect. RF performance is central and important to product development, while the kink effect impacts the switching time between gain modes, which may involve going from one current gain mode to another current gain mode. As communication protocols become increasingly stringent, there is a need for faster switching. This switching speed is limited by the inherent transistor device design process. Additionally, the switching delay cannot be completely fixed by design or software.

SUMMARY

A radio frequency (RF) device is described. The RF device includes a semiconductor-on-insulator (SOI) substrate having a first-type diffusion region. The RF device also includes a transistor including a source region and a drain region in the first-type diffusion region, a gate region between the source region and the drain region, and a body region. The RF device further includes a second-type diffusion region, comprising a gate overlap region partially overlapped by the gate region to define the body region and a second-type diffusion encroachment region in the source region and adjoining the gate overlap region to form a body terminal region, in which a silicidation layer shorts the body terminal region to the source region.

A method of constructing a radio frequency (RF) device is described. The method includes implanting a first-type diffusion region in a semiconductor-on-insulator (SOI) substrate. The method also includes forming a transistor including a source region and a drain region in the first-type diffusion region, a gate region between the source region and the drain region, and a body region. The method further includes forming a second-type diffusion region, comprising a gate overlap region partially overlapped by the gate region to define the body region and a second-type diffusion encroachment region in the source region and adjoining the gate overlap region to form a body terminal region. The method also includes depositing a silicidation layer to short the body terminal region to the source region.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
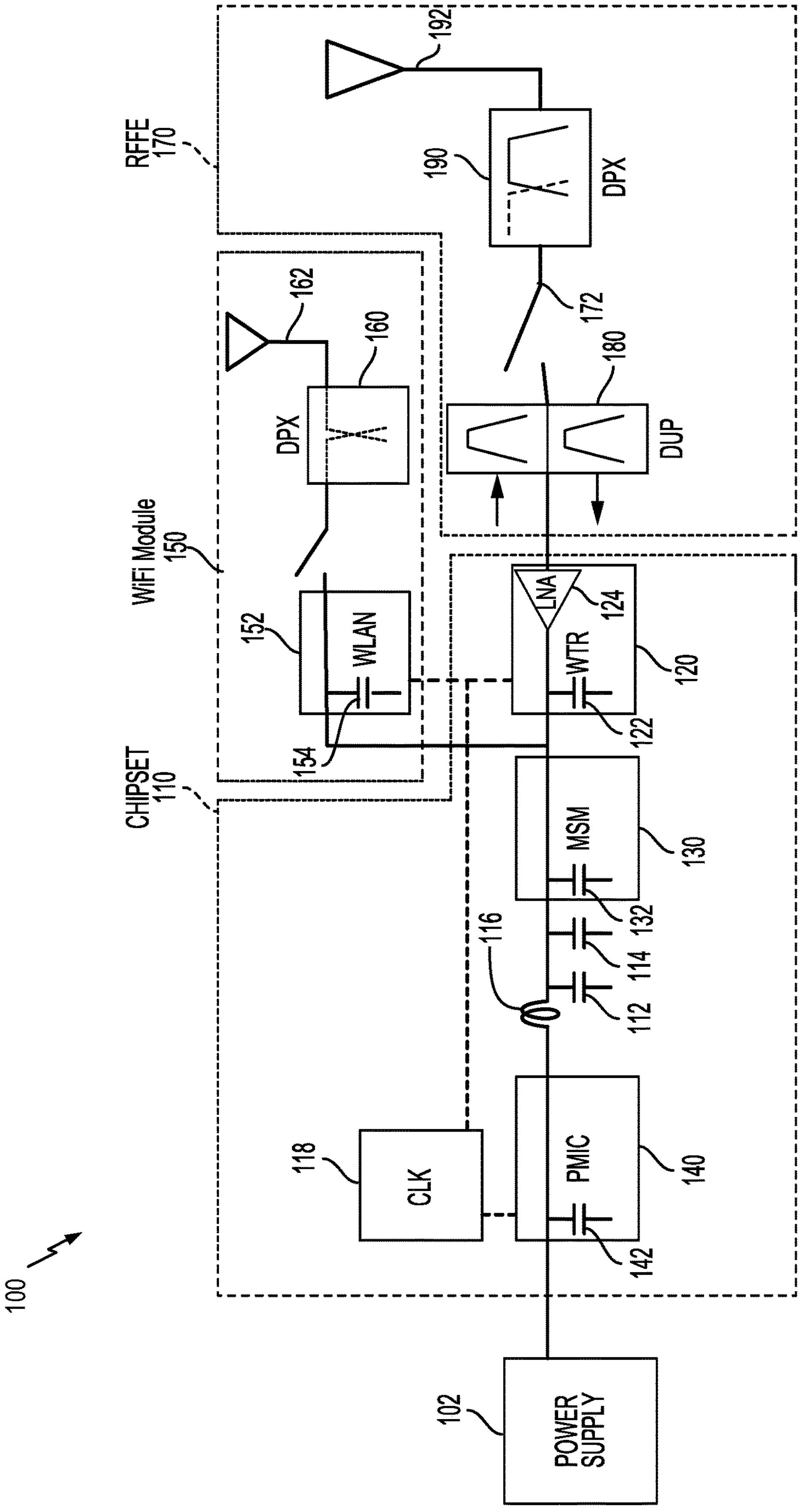
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers may include using semiconductor-on-insulator (SOI) technology. SOI technology replaces conventional silicon substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer.

The active devices on the SOI layer may include high performance complementary metal oxide semiconductor (CMOS) transistors. For example, high performance CMOS RF switch technologies are currently manufactured using SOI substrates. An RF front end (RFFE) may rely on these high-performance CMOS RF switch technologies for successful operation. A process for fabricating an RFFE, therefore, involves the costly integration of an SOI wafer for supporting these high-performance CMOS RF switch technologies. Furthermore, support for future RF performance enhancements involves increased device isolation while reducing RF loss.

One technique for increasing device isolation and reducing RF loss is fabricating an RFFE product using SOI wafers. For example, an RF device (e.g., an LNA RF device) may include transistors fabricated using an SOI wafer. Unfortunately, transistors fabricated using SOI technology may suffer from the floating body effect. The floating body effect is a phenomenon in which the transistor's body collects minority charge carriers in inversion region of operation of the transistor device. In this case, the charge that accumulates in the body causes adverse effects, such as parasitic transistors in the structure and OFF-state leakage. In addition, the accumulated charge also causes dependence (reduction) of the threshold voltage of the transistor on its previous states.

For example, high performance low noise amplifiers (LNAs) are currently manufactured using SOI substrates. Additionally, traditional floating body (FB) LNAs exhibit great RF-SOI performance but suffer from the noted floating body effect. As described, this floating body effect is referred to as a kink effect. RF performance is central and important to product development, while the kink effect detrimentally impacts the switching time between the gain modes, which may involve going from one current gain mode to another current gain mode. As communication protocols become more stringent, faster switching is specified. This switching speed is limited by the inherent transistor device design process. Additionally, the switching delay cannot be completely fixed by design or software.

Various aspects of the present disclosure provide techniques for an enhanced body tied to source LNA RF device. The process flow for semiconductor fabrication of the enhanced body tied to source LNA RF device may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Aspects of the present disclosure relate to an enhanced body tied to source (E-BTS) LNA device. That is, various aspects of the present disclosure employ a second-type implant region that is partially overlapped by a gate region and a source region in a first-type diffusion region to couple the source region to a floating body region of the transistor.

Various aspect of the present disclosure are directed to an E-BTS LNA, including an SOI substrate having a first-type diffusion region. The E-BTS LNA also includes a transistor having a source region and a drain region in the first-type diffusion region of the SOI substrate. The transistor also includes a gate region between the source region and the drain region, which includes a floating body region. In various aspects of the present disclosure the E-BTS LNA includes a second-type implant region partially overlapped by the gate region and the source region in the first-type diffusion region to couple the floating body region of the first transistor to the source region.

FIG. 1 is a schematic diagram of a wireless device 100 (e.g., a cellular phone or a smartphone) including an enhanced body tied to source (E-BTS) low noise amplifier (LNA) device, according to aspects of the present disclosure. The wireless device 100 has a wireless local area network (WLAN) (e.g., WIFI) module 150 and a radio frequency (RF) front end (RFFE) module 170 for a chipset 110. The WIFI module 150 includes a first diplexer 160 communicably coupling an antenna 162 to a wireless local area network module (e.g., WLAN module 152). The RFFE 170 includes the second diplexer 190 communicably coupling an antenna 192 to the wireless transceiver (WTR) 120 through a duplexer (DUP) 180. An RF switch 172 communicably couples the second diplexer 190 to the duplexer 180. In a receive path, the antenna 192 receives communication signals and provides a received RF signal, which is routed through the second diplexer 190, the RF switch 172, the duplexer 180 and provided an LNA 124 of the WTR 120.

In this example, the wireless transceiver 120 and the WLAN module 152 of the WIFI module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The WTR 120 of the wireless device 100 includes a mobile RF transceiver to transmit and receive data for two-way communication. A mobile RF transceiver may include a transmit section for data transmission and a receive section for data reception. For data transmission, the transmit section may modulate an RF signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section of the WTR 120 may obtain a received RF signal via the antenna 192 and may amplify the received RF signal using the LNA 124 and process the received RF signal to recover data sent by the base station in a communication signal.

The WTR 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in numerous ways to amplify the communication signals. Assorted options exist for fabricating the transistors that are configured to amplify the communication signals transmitted and received by the WTR 120.

The WTR 120 and the RFFE 170 may be implemented using semiconductor-on-insulator (SOI) technology for fabricating transistors of the WTR 120, which helps reduce high order harmonics in the RFFE 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. An active device fabricated using SOI technology is shown in FIG. 2.

Figure 2:
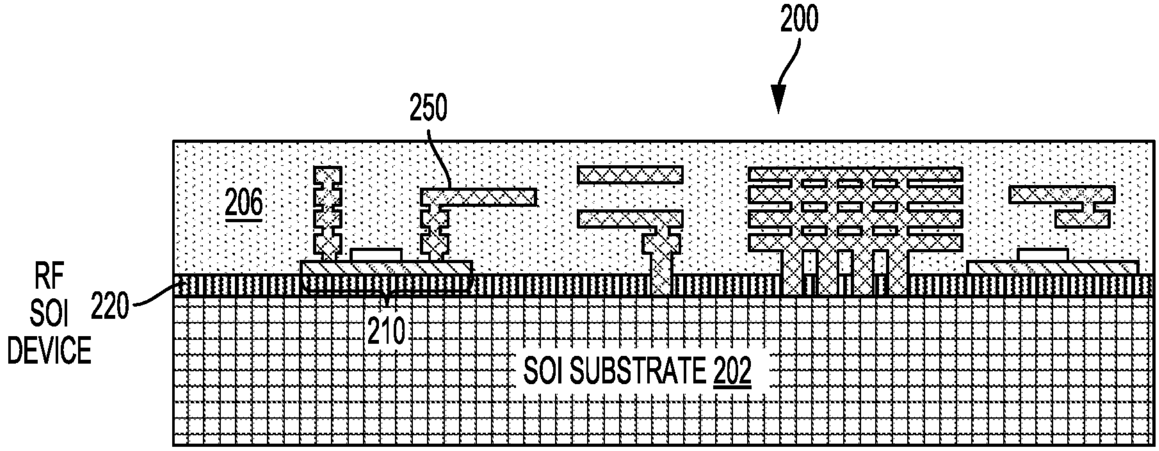
FIG. 2 shows a cross-sectional view of a radio frequency (RF) integrated circuit (RFIC), including an RF silicon-on-insulator (SOI) device.

FIG. 2 shows a cross-sectional view of a radio frequency (RF) integrated circuit (RFIC) 200. As shown in FIG. 2, an RF semiconductor-on-insulator (SOI) device includes an active device 210 on a buried oxide (BOX) layer 220 supported by an SOI substrate 202 (e.g., a silicon wafer). The RF-SOI device may be fabricated as a complementary metal oxide semiconductor (CMOS) transistor using a CMOS process. The RF-SOI device also includes interconnects 250 coupled to the active device 210 within a first dielectric layer 206. In this configuration, a parasitic capacitance of the RF-SOI device is proportional to a thickness of the BOX layer 220, which determines the distance between the active device 210 and the SOI substrate 202.

The active device 210 on the BOX layer 220 may be a CMOS transistor. For example, high performance CMOS RF switch technologies are currently manufactured using SOI substrates. The RFFE 170 (FIG. 1) may rely on these high-performance CMOS RF technologies for successful operation. A process for fabricating the RFFE 170, therefore, involves integration of an SOI wafer to support these high-performance CMOS RF technologies. Furthermore, support for future RF performance enhancements involves increased device isolation while reducing RF loss. The RFIC 200 may be used to implement the RFFE 170 in FIG. 1. For example, the active device 210 may be a switch field effect transistor (FET) of the LNA 124 of the WTR 120.

One technique for increasing device isolation and reducing RF loss is fabricating an RFFE using SOI wafers. For example, an RF device (e.g., an RF low noise amplifier (LNA) device) may include transistors fabricated using an SOI wafer. Unfortunately, transistors fabricated using SOI technology may suffer from the floating body effect. The floating body effect is a phenomenon in which the transistor's body collects a charge generated at junctions of the transistor device. In this case, the charge that accumulates in the body causes adverse effects, such as parasitic transistors in the structure and OFF-state leakage. In addition, the accumulated charge also causes dependence of the threshold voltage of the transistor on its previous states. In this example, the active device 210 may be a field effect transistor (FET) of the LNA 124 of the WTR 120 of FIG. 1.

For example, high performance LNAs are currently manufactured using SOI substrates. Additionally, traditional floating body (FB) LNAs exhibit great RF-SOI performance but suffer from the noted floating body effect. As described, this floating body effect is referred to as a kink effect. RF performance is central and important to product development, while the kink effect detrimentally impacts the switching time between gain modes, which may involve switching from one current gain mode to another current gain mode. As communication protocols become more stringent, faster switching is specified. This switching speed is limited by the inherent transistor device design process. Additionally, the switching delay cannot be completely fixed by design or software.

Figure 3:
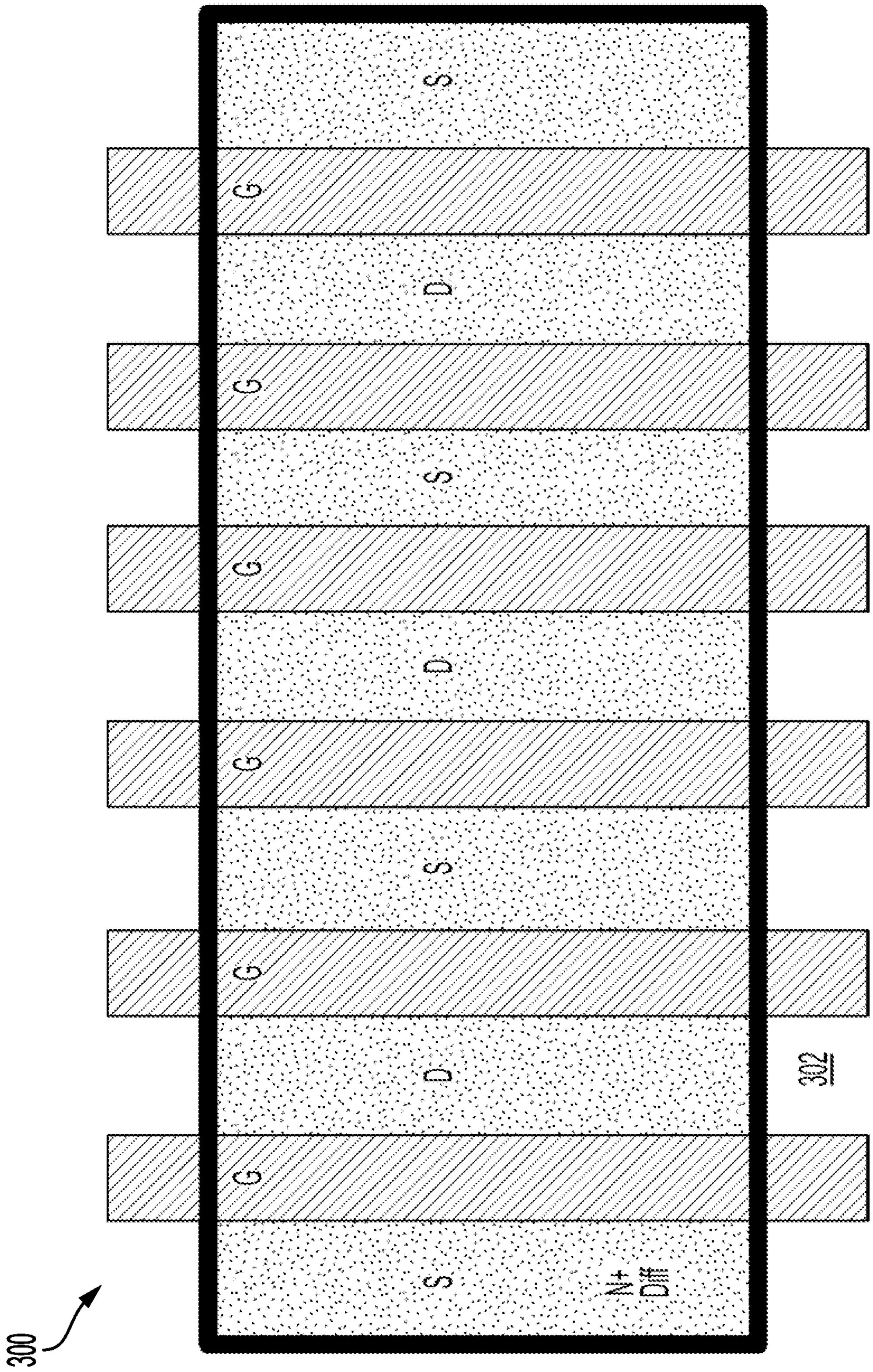
FIG. 3 is a schematic diagram illustrating a top-down view of a floating body (FB) transistor for implementing a low noise amplifier (LNA), according to aspects of the present disclosure.

FIG. 3 is a schematic diagram illustrating a top-down view of a floating body (FB) transistor for implementing a low noise amplifier (LNA), such as the LNA 124 of the WTR 120 shown in FIG. 1, according to aspects of the present disclosure. In this configuration, an FB LNA 300 includes a first type (e.g., N-type) diffusion region (e.g., N+ Diff) in which various source(S) and drain (D) regions are formed and separated by various gate (G) regions. In this example, the FB LNA 300 is a high-performance RF device manufactured using an SOI substrate 302. While the FB LNA 300 exhibits great RF-SOI performance, the FB LNA 300 suffers from the noted floating body effect. As described, this floating body effect is referred to as a kink effect.

In operation, the floating body configuration of the FB LNA 300 yields improved RF performance, which is central and important to product development. Nevertheless, the kink effect caused by the floating body configuration of the FB LNA 300 detrimentally impacts the switching time between gain modes, which may involve going from one current gain mode to another current gain mode. As communication protocols become more stringent, faster switching is specified for operation of the FB LNA 300. This switching speed is limited by the inherent transistor device design process. Additionally, the switching delay cannot be completely fixed by design or software. By contrast, traditional body contacted RF-SOI devices have no kink effect but exhibit a significantly degraded RF-performance (e.g., 30%) compared to the FB LNA 300.

Various aspects of the present disclosure are directed to an enhanced body tied to source (E-BTS) RF device. These aspects of the present disclosure provide a transistor configuration that exhibits the RF performance of a floating body field effect transistor (FET) to provide a significantly improved unity current gain frequency (ft) and a maximum oscillation frequency (fmax)(ft/fmax) at a given current. In various aspects of the present disclosure, a second-type implant region is partially overlapped by a gate region and a source region in a first-type diffusion region of an SOI substrate to couple the source region to a floating body region of a transistor. The enhanced body tied to source transistor configuration enables a body charge to exit at a sufficient rate for supporting nanosecond switching speed between gain state, which is a body contacted device feature, for example, as shown in FIG. 4.

Figure 4:
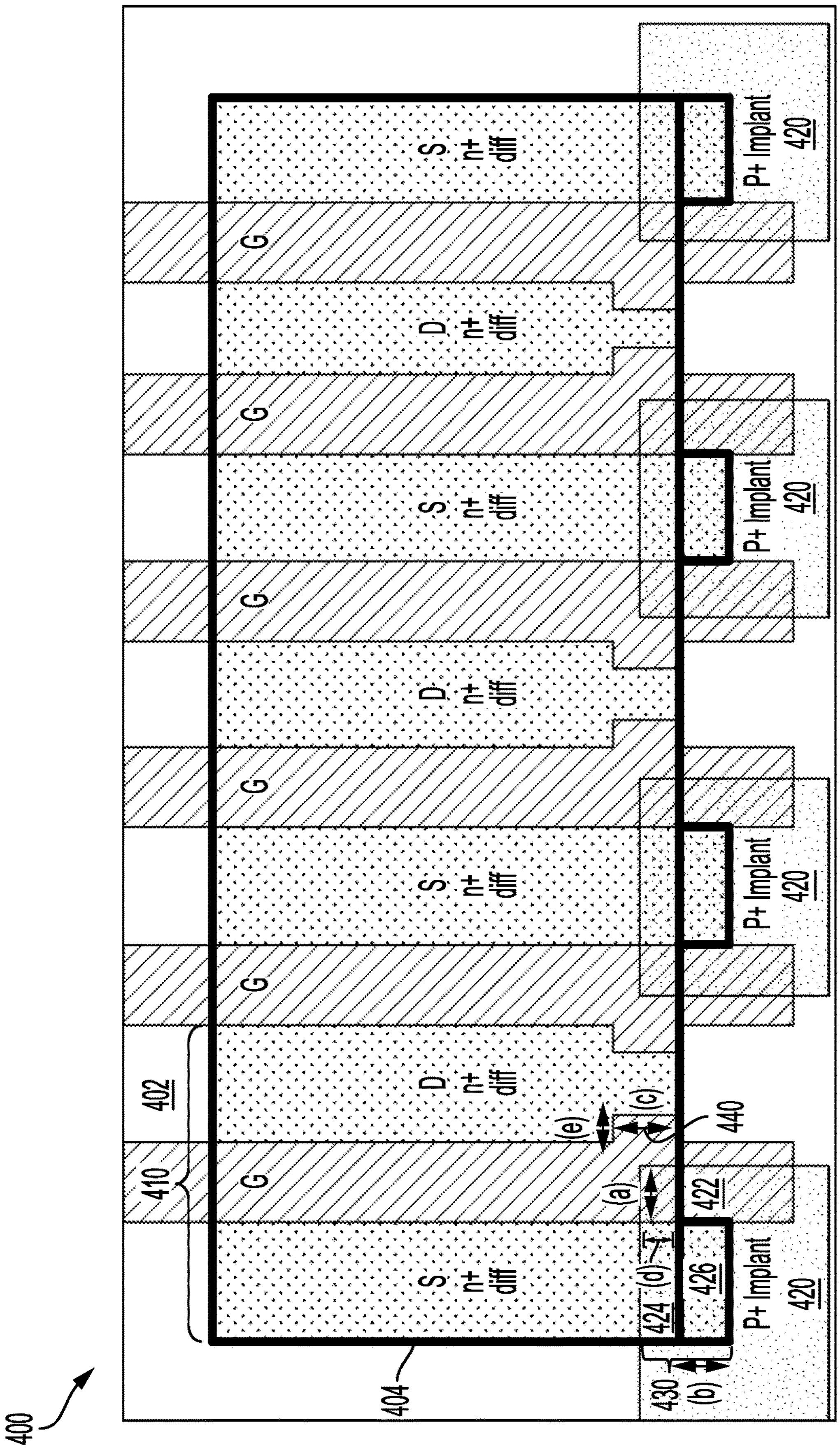
FIG. 4 is a schematic diagram illustrating an enhanced body tied to source (E-BTS) low noise amplifier (LNA) radio frequency (RF) device, according to various aspects of the present disclosure.

FIG. 4 is a schematic diagram illustrating an enhanced body tied to source (E-BTS) low noise amplifier (LNA) radio frequency (RF) device 400, according to various aspects of the present disclosure. In this example, the E-BTS LNA RF device 400 includes a semiconductor-on-insulator (SOI) substrate 402 having a first-type diffusion region 404 (e.g., N-type). The E-BTS LNA RF device 400 also includes a transistor 410 having a source region (S) and a drain region (D) in the first-type diffusion region 404 of the SOI substrate 402. The transistor 410 includes a gate region (G) between the source region (S) and the drain region (D), which includes a floating body region (not shown). In various aspects of the present disclosure, a second-type implant region 420 (e.g., P-type) partially overlapped by the gate region (G) of the E-BTS LNA RF device 400 is used to form a second-type diffusion region 430 in the source region (S) and adjoining the first-type diffusion region 404 to couple the body region of the transistor 410 to the source region (S).

According to various aspects of the present disclosure, the second-type diffusion region 430 includes a gate overlap region 422, in which a dimension (a) indicates the second-type implant region 420 (e.g., P+) overlap of a polysilicon (poly) layer of the gate region (G), which may define a body region of the transistor underneath the gate region (G), and which may be half of a minimum poly length, or the minimum defined mask overlap according to technology capabilities. Additionally, the second-type diffusion region 430 includes a second-type diffusion encroachment region 424, in which a dimension (d) indicates a width of the second-type diffusion encroachment region 424 inside the source region (S), which is less than three percent (<3%) of the total diffusion width of the first-type diffusion region 404. In various aspects of the present disclosure, the second-type diffusion encroachment region 424 combined with gate overlap region 422 defines a small fractional body connection sufficient to the provide a fixed body potential for an entire device width of the E-BTS transistor 410. In various aspects of the present disclosure, the width of the first-type diffusion region 404 in the source region (S) is less than the width of the first-type diffusion region 404 in the drain region (D), according to the dimension (d). Additionally, a non-rectangular share of the drain region (D) is different from the rectangular share of the source region (S).

FIG. 4 further illustrates the second-type diffusion region 430, including a second-type diffusion extension region 426 of the source region (S), in which a dimension (b) indicates an extension of the second-type diffusion region 430 on the side of the source region (S). Advantageously, the second-type diffusion extension region 426 reduces unwarranted capacitance (e.g., a gate to drain capacitance (Cgd) and/or a gate to body capacitance (Cgb)) suffered by conventional body tied to source transistors, while maintaining fixed body potential. For example, the second-type diffusion extension region 426 may be eight percent (5-8%) of the overall width of the first-type diffusion region 404. The second-type diffusion extension region 426 in combination with the second-type diffusion encroachment region 424 provides a body terminal region that is shorted to the source region (S), as defined by first-type diffusion region 404, which beneficially reduces the body resistance of the transistor 410 without sacrificing a unity current gain frequency (ft).

Additionally, a poly gate extension 440 of the gate region (G) is shown, in which a dimension (c) indicates a width of the poly gate extension 440 on a side of a drain region (D) to form a higher gate length (Lg) device at an end of the gate region (G). The dimension (c) of the poly gate extension 440 may be determined according to a process margin and implant variability control, which is typically less than five percent (<5%) of an overall device width. The poly gate extension 440 beneficially prevents body overlap mask bias issues and accidental shorting of the device. The poly gate extension 440 further includes a dimension (e), which defines a length of the poly gate extension 440 to define a larger gate length (Lg) for a fraction of the total width. The dimension (e) of the poly gate extension 440 builds in a process margin for variability/yield by preventing body overlap mask bias issues and accidental shorting of the device. Additionally, a non-rectangular share of the drain region (D) is different from the rectangular share of the source region (S) as a result of the poly gate extension 440. As described below, various combinations of the dimensions (a)-(e) can be implemented to derive a final configuration of the E-BTS LNA RF device 400, for example, as shown in FIGS. 5-14.

Figure 5:
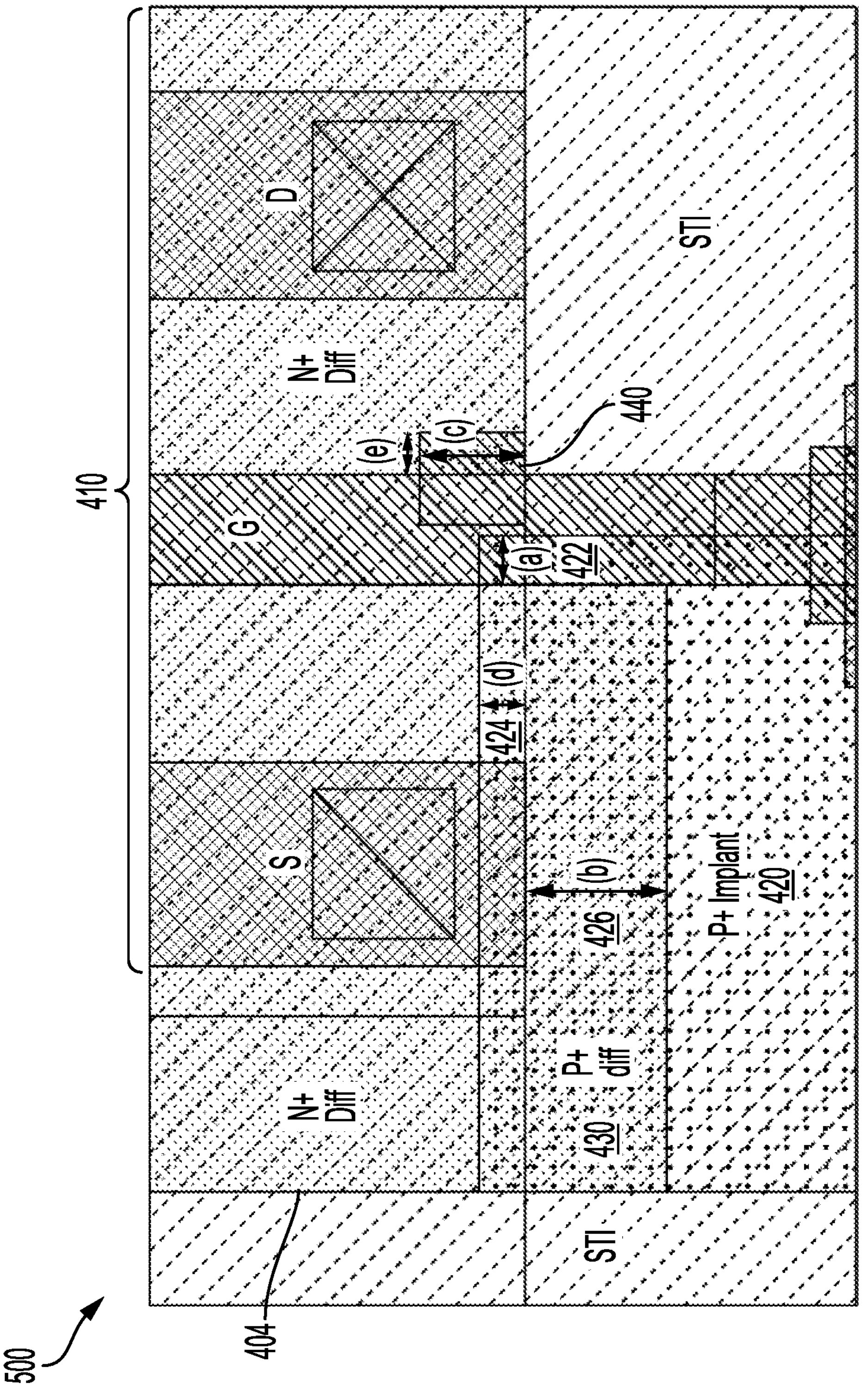
FIG. 5 is a schematic diagram illustrating a layout view of an enhanced body tied to source (E-BTS) transistor shown in FIG. 4, according to various aspects of the present disclosure.

FIG. 5 is a schematic diagram illustrating a layout view 500 of the enhanced body tied to source (E-BTS) transistor 410 shown in FIG. 4, according to various aspects of the present disclosure. In this example, the layout view 500 of the transistor 410 is shown with reference to shallow trench isolation (STI) regions. Additionally, the second-type diffusion region 430 is provided near the edge of the first-type diffusion region 404 to partially overlap the gate region (G) and the source region (S) to provide a body contact shorted to the source region (S) by silicidation and a body connection to a body region of the channel under the gate of the gate region (G). A cross-sectional view further illustrating the second-type diffusion region 430 near the edge of the first-type diffusion region 404 to partially overlap the gate region (G) and the source region (S) to provide a body contact shorted to the source region (S) by silicidation and a body connection to a body region of the channel under the gate of the gate region (G) is shown in FIG. 6.

Figure 6:
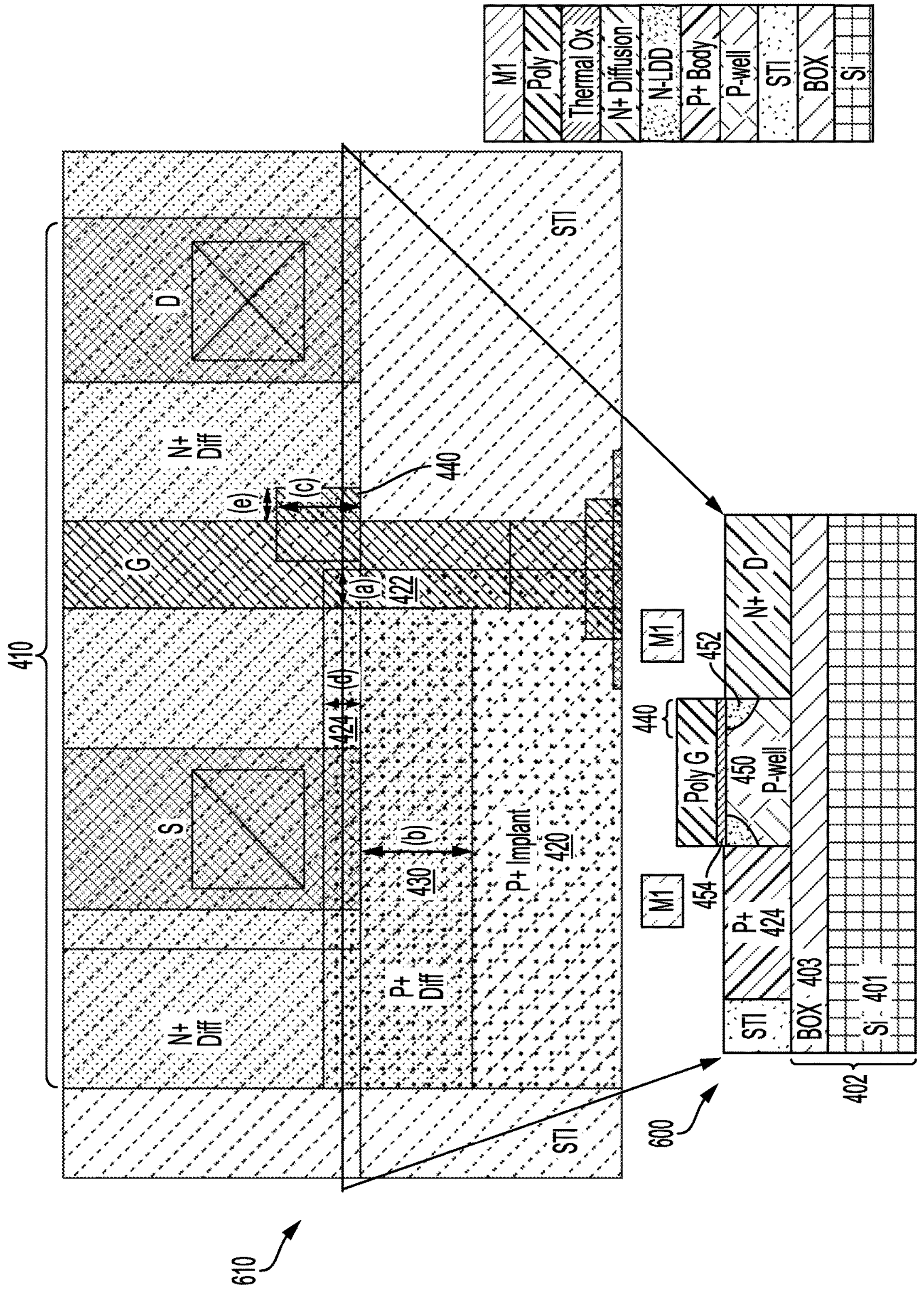
FIG. 6 is a schematic diagram illustrating a cross-sectional view of the transistor shown in the layout view of FIG. 5, in accordance with various aspects of the present disclosure.

FIG. 6 is a schematic diagram illustrating a cross-sectional view 600 of the transistor 410 shown in the layout view of FIG. 5, in accordance with aspects of the present disclosure. As shown in FIG. 6, the cross-sectional view 600 of the transistor 410 is shown along the cutline 610 of the transistor 410 slightly inside the edge of the second-type implant region 420. In this example, the SOI substrate 402 of the transistor 410 is shown, including a silicon layer 401 supporting a buried oxide layer (BOX) 403. In various aspects of the present disclosure, the second-type implant region 420 is shown as a P+ implant region formed on a surface of the BOX 403, and adjacent to a device channel well 450 (e.g., a P-well) of the gate region (G). In this example, the device channel well 450 includes N-type lightly doped drain regions (N-LDD) 452 and supports the gate region (G) through a thermal oxide layer 454. Additionally, first metal layer (M1) interconnects are also shown without zero metal layer (M0) interconnects to the source region (S) and the drain region (D) of the transistor 410. The poly gate extension 440 is on a side of a drain region (D) to form a higher gate length (Lg) device at an end of the gate region (G).

Figure 7:
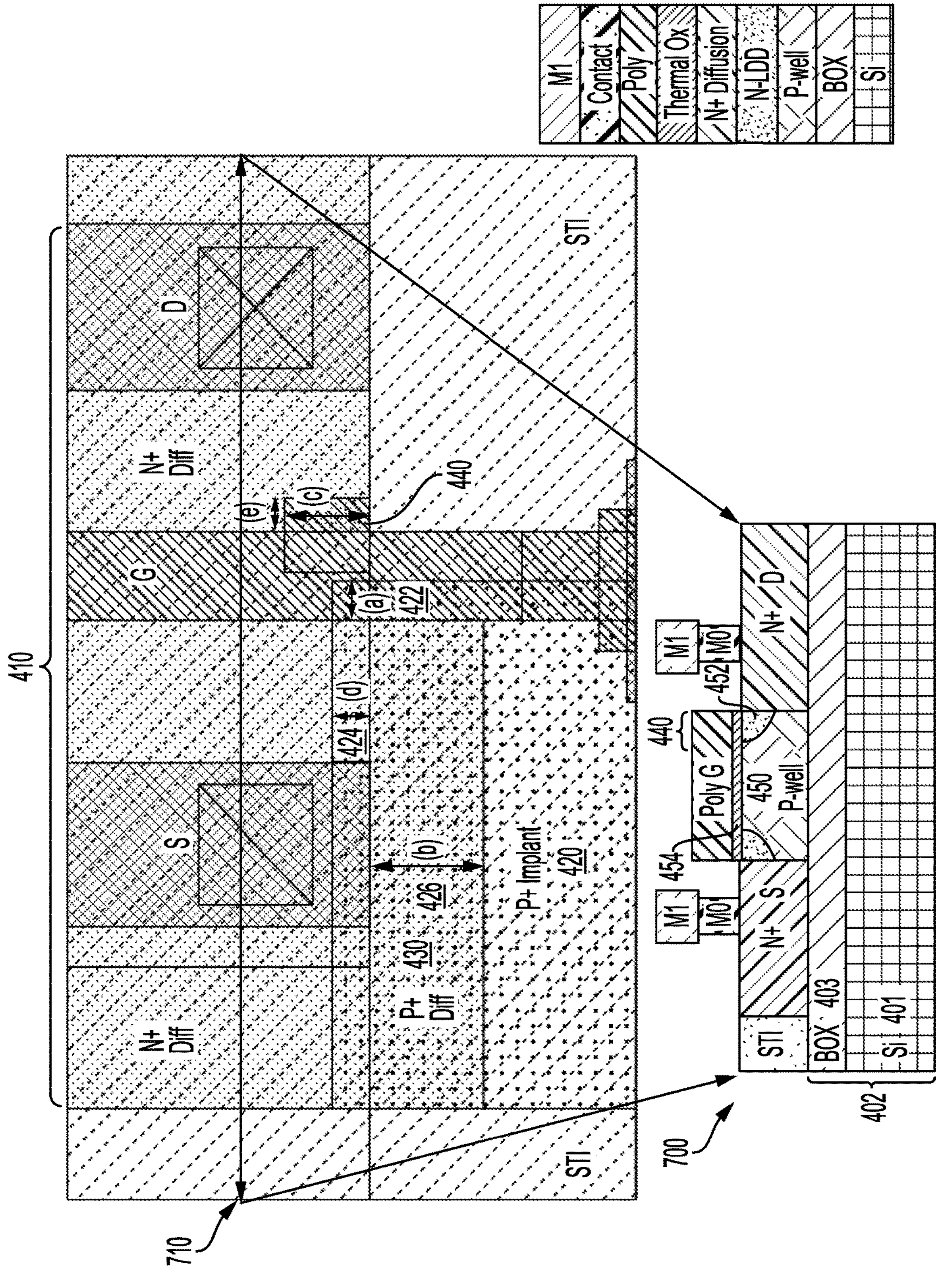
FIG. 7 is a schematic diagram illustrating a cross-sectional view of the transistor shown in the layout view of FIG. 5, in accordance with aspects of the present disclosure.

FIG. 7 is a schematic diagram illustrating a cross-sectional view 700 of the transistor 410 shown in the layout view of FIG. 5, in accordance with aspects of the present disclosure. As shown in FIG. 7, the cross-sectional view 700 of the transistor 410 is shown along the cutline 710 of the transistor 410, outside the edge of the second-type diffusion region 430. In this example, the cutline 710 is outside the second-type diffusion region 430 and, therefore, the source region (S) is shown adjacent to the device channel well 450. Additionally, the first metal layer M1 interconnects are shown with zero metal layer (M0) interconnects to the source region (S) and the drain region (D) of the transistor 410. The poly gate extension 440 is also shown on the side of the drain region (D) to increase the gate length (Lg) of the gate region (G).

Figure 8:
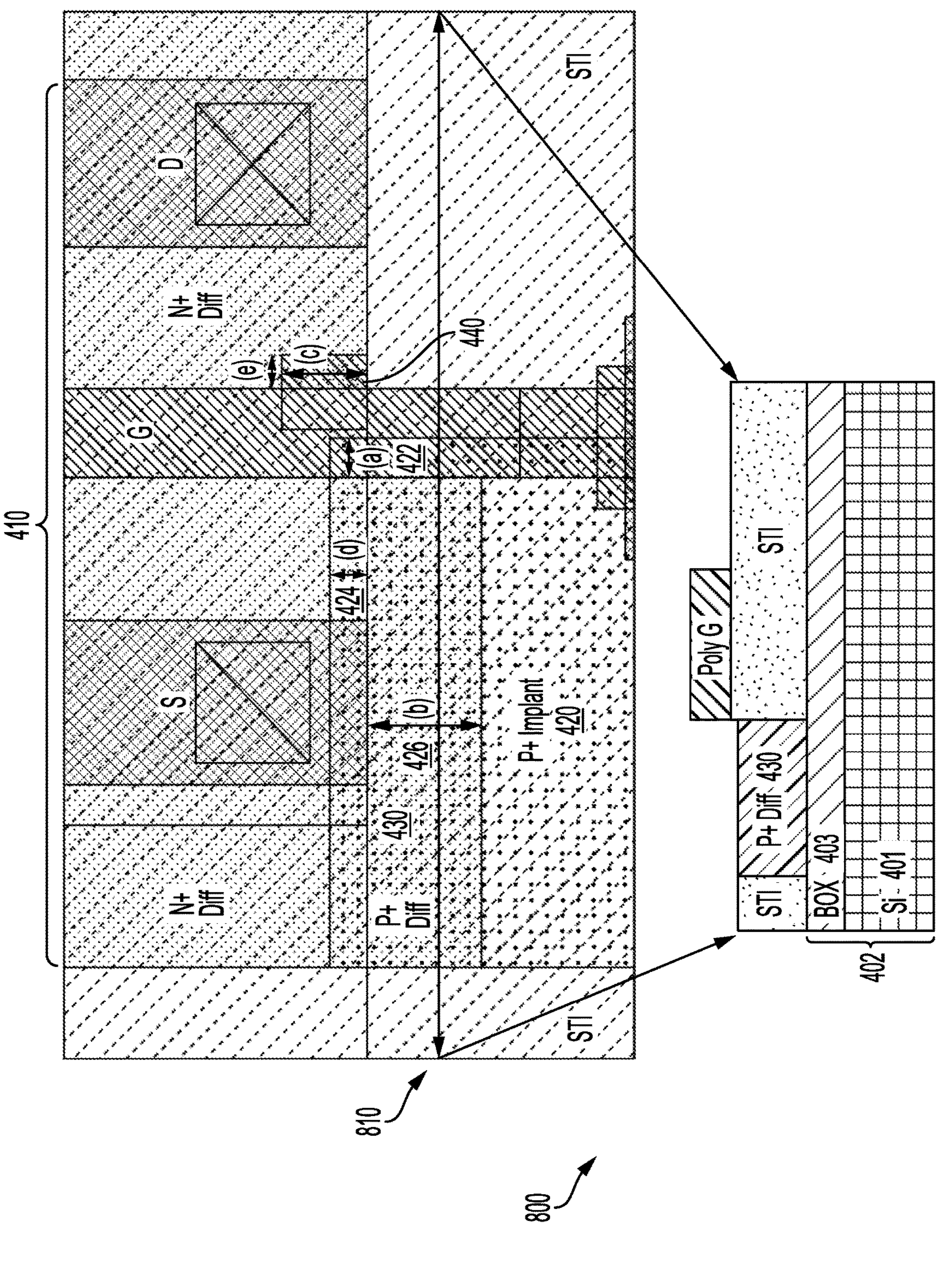
FIG. 8 is a schematic diagram illustrating a cross-sectional view of the transistor shown in the layout view of FIG. 5, in accordance with various aspects of the present disclosure.

FIG. 8 is a schematic diagram illustrating a cross-sectional view 800 of the transistor 410 shown in the layout view of FIG. 5, in accordance with aspects of the present disclosure. As shown in FIG. 8, the cross-sectional view 800 of the transistor 410 is shown along the cutline 810 of the transistor 410, outside an edge of the first-type diffusion region 404. In this example, the cutline 810 is outside the first-type diffusion region 404 and, therefore, the source region (S), the device channel well 450, and the drain region (D) are not shown. In these aspects of the present disclosure, the second-type implant region 420 intersection with a diffusion region defines the second-type diffusion region 430 (e.g., a P+ region) formed on an undoped surface of the BOX 403, between STI regions. In this example, the gate region (G) is shown on an STI region, outside of the poly gate extension 440, on the side of the drain region (D).

Figure 9:
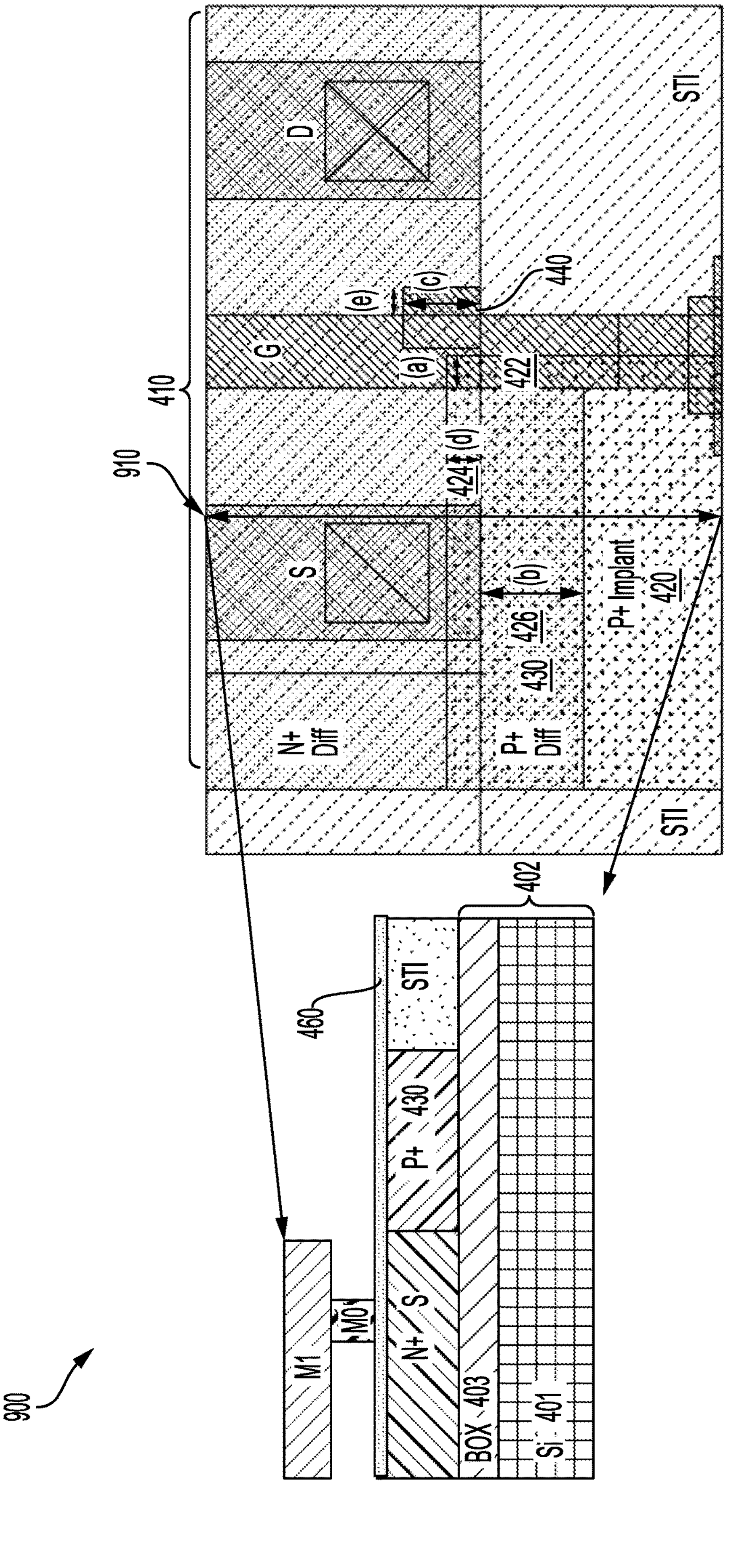
FIG. 9 is a schematic diagram illustrating a cross-sectional view of the transistor shown in the layout view of FIG. 5, in accordance with various aspects of the present disclosure.

FIG. 9 is a schematic diagram illustrating a cross-sectional view 900 of the transistor 410 shown in the layout view of FIG. 5, in accordance with aspects of the present disclosure. As shown in FIG. 9, the cross-sectional view 900 of the transistor 410 is shown along the cutline 910 of the transistor 410, parallel and outside the gate region (G). In this example, the cutline 910 is outside the drain region (D) as well as the gate region (G) and, therefore, the device channel well 450 and the drain region (D) are not shown. Additionally, the P+ implant region 420 is shown as an STI region because a P+ implant into an STI region results in an STI region. By contrast, an undoped diffusion region for the first-type diffusion region 404 in the source region (S) is reduced according to the dimension (d). In this example, this undoped region extends the source region (S) according to the dimension (b), in which the P+ implant in the undoped regions forms the second-type diffusion region 430, as shown in the cross-section.

In these aspects of the present disclosure, the second-type diffusion region 430 (e.g., P+ Diff) is formed from a combination of the second-type diffusion extension region 426 and the second-type diffusion encroachment region 424, which is formed from an undoped region on the surface of the BOX 403 between the source region (S) and the STI region. In various aspects of the present disclosure, a silicidation layer 460 is deposited to short the diffusion region, including the second-type diffusion encroachment region 424 and the second-type diffusion extension region 426 to the first-type diffusion region 404 of the source region (S). Additionally, the M1 metal layer interconnect is shown with the M0 metal layer interconnect to the source region (S) of the transistor 410.

Figure 10:
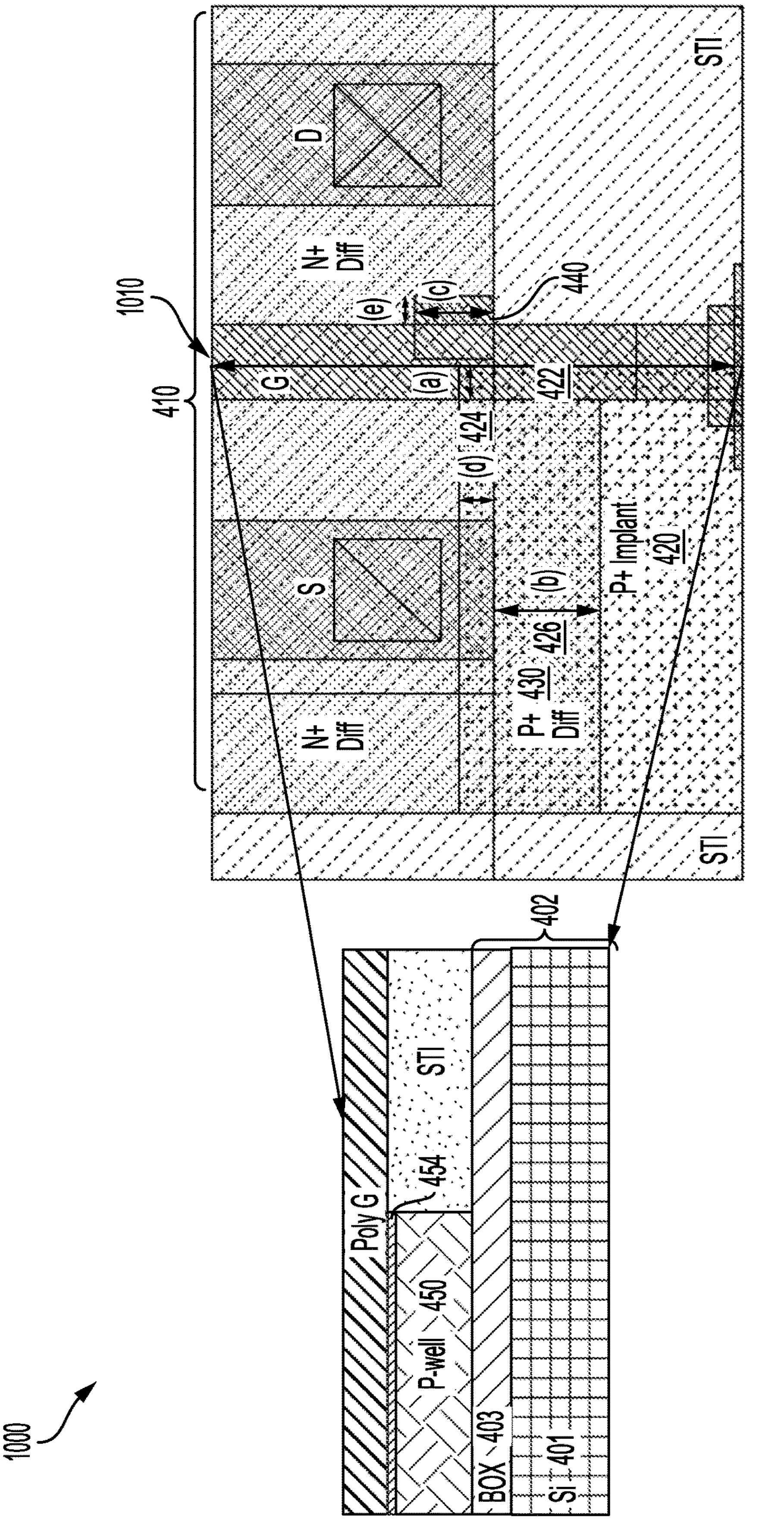
FIG. 10 is a schematic diagram illustrating a cross-sectional view of the transistor shown in the layout view of FIG. 5, in accordance with various aspects of the present disclosure.

FIG. 10 is a schematic diagram illustrating a cross-sectional view 1000 of the transistor 410 shown in the layout view of FIG. 5, in accordance with aspects of the present disclosure. As shown in FIG. 10, the cross-sectional view 1000 of the transistor 410 is shown along the cutline 1010 through the gate region (G) of the transistor 410. In this example, the cutline 1010 is through the gate region (G) and, therefore, the source region, the second-type implant region 420, and the drain region (D) are not shown. In these aspects of the present disclosure, the gate region (G) is shown on a surface of the STI region and the thermal oxide layer 454 on the device channel well 450.

Figure 11:
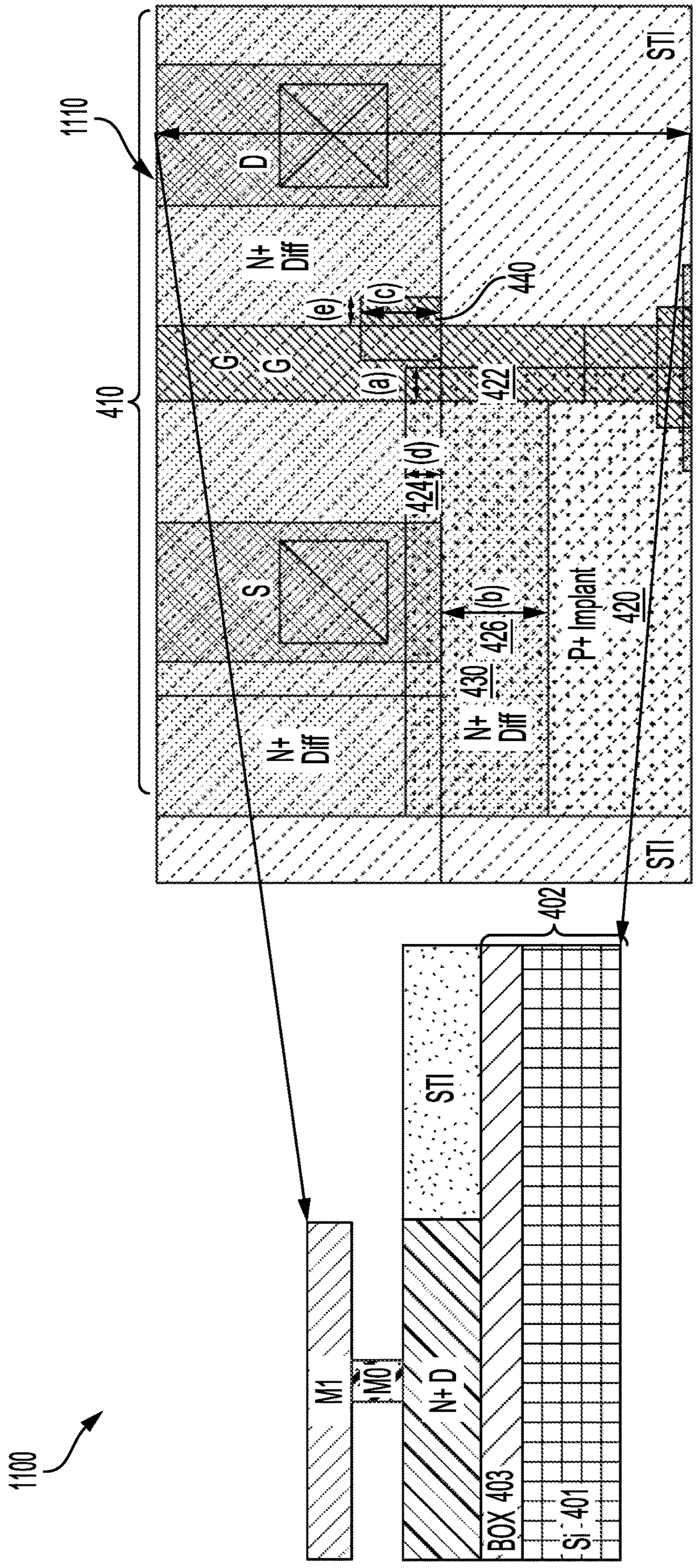
FIG. 11 is a schematic diagram illustrating a cross-sectional view of the transistor shown in the layout view of FIG. 5, in accordance with various aspects of the present disclosure.

FIG. 11 is a schematic diagram illustrating a cross-sectional view 1100 of the transistor 410 shown in the layout view of FIG. 5, in accordance with aspects of the present disclosure. As shown in FIG. 11, the cross-sectional view 1100 of the transistor 410 is shown along the cutline 1110, through the drain region (D) of the transistor 410. In this example, the cutline 1110 is through the drain region (D) and, therefore, the source region (S), the device channel well 450, and the gate region (G) are not shown. In these aspects of the present disclosure, the drain region D (e.g., N+) is formed on the surface of the BOX 403, adjacent to the STI region. Additionally, the M1 metal layer interconnect is shown with the M0 metal layer interconnect to the drain region D of the transistor 410.

Figure 12A:
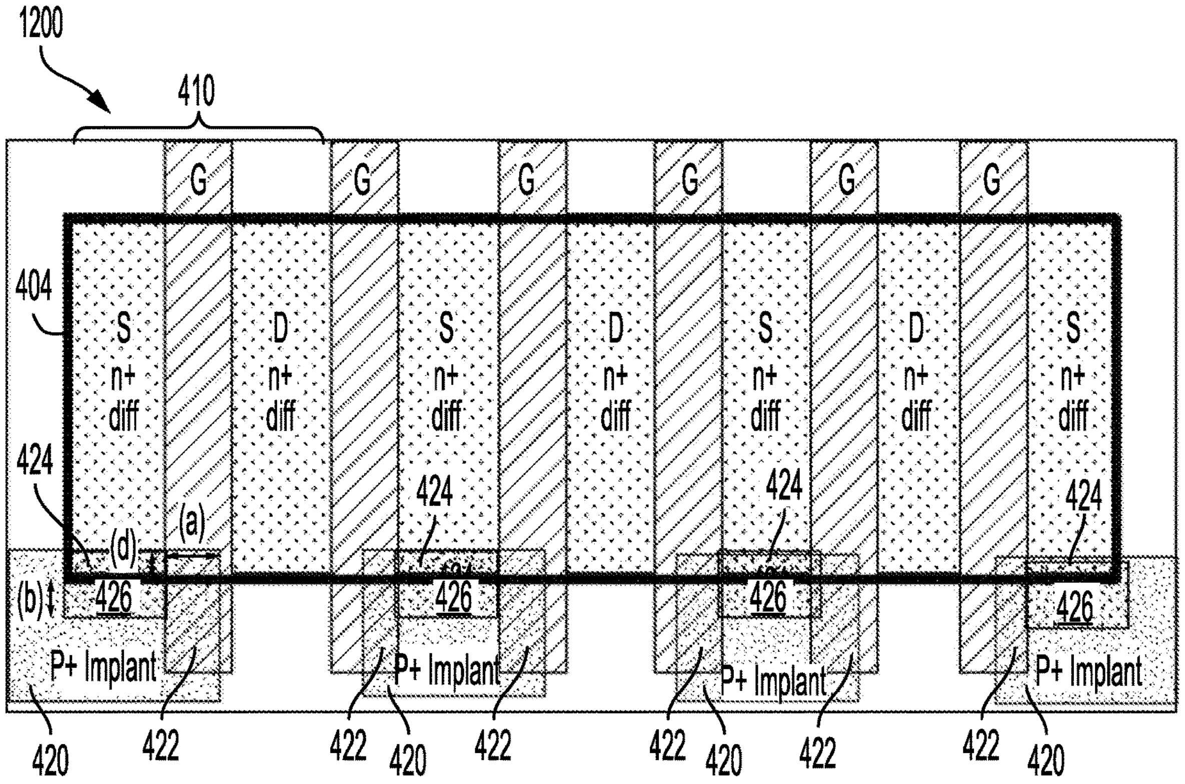
FIGS. 12A and 12B are schematic diagrams illustrating a top-down view and a layout view of an enhanced body tied to source (E-BTS) low noise amplifier (LNA) radio frequency (RF) device, according to various aspects of the present disclosure.
Figure 12B:
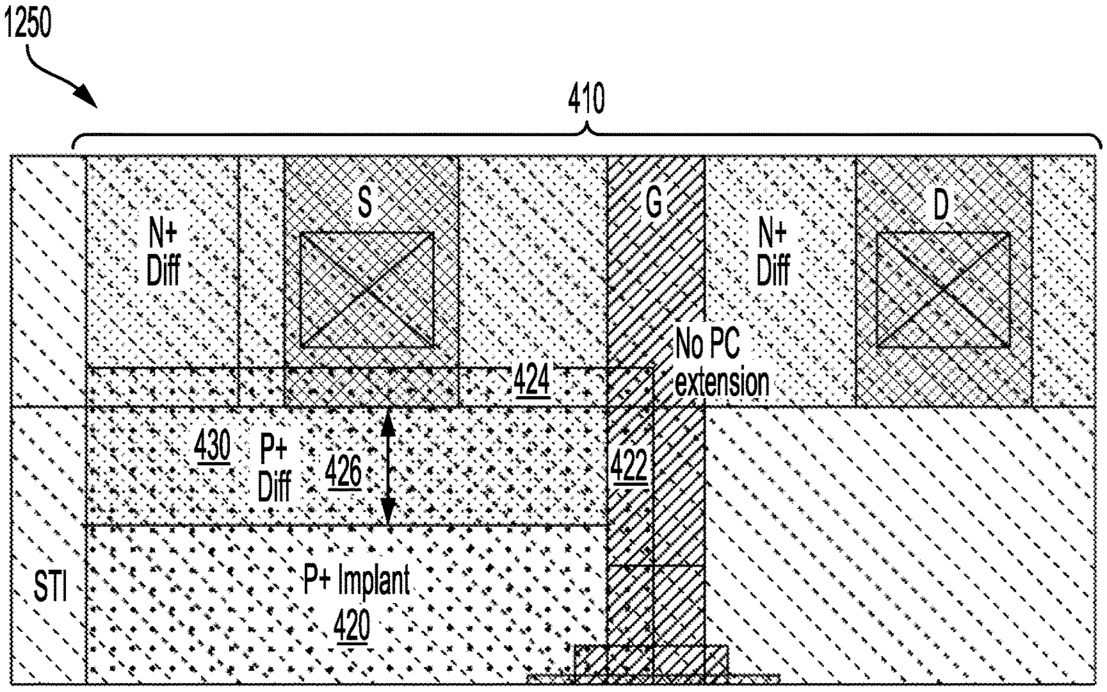

FIGS. 12A and 12B are schematic diagrams illustrating a top-down view and a layout view of an enhanced body tied to source (E-BTS) low noise amplifier (LNA) radio frequency (RF) device, according to various aspects of the present disclosure. FIG. 12A illustrates an E-BTS LNA RF device 1200 including the SOI substrate 402 having the first-type diffusion region 404 of FIG. 4. The E-BTS LNA RF device 1200 also includes the transistor 410 having the source region (S) and the drain region (D) in the first-type diffusion region 404 of the SOI substrate 402. The transistor 410 includes the gate region (G) between the source region (S) and the drain region (D), which includes a floating body region (not shown). In various aspects of the present disclosure, the E-BTS LNA RF device 1200 includes the second-type implant region 420 (e.g., P-type) partially overlapped by the gate region (G) and the source region (S) in the first-type diffusion region 404 to couple the floating body region of the transistor 410 to the source region (S).

According to various aspects of the present disclosure, the second-type diffusion region 430 includes the gate overlap region 422, in which the dimension (a) indicates the second-type implant region 420 overlap of the poly layer of the gate region (G), which may define a body region of the transistor underneath the gate region (G). Additionally, the second-type diffusion region 430 includes the second-type diffusion encroachment region 424, in which the dimension (d) indicates the width of the second-type diffusion region 430 inside (e.g., encroaching on) the source region (S). Additionally, the second-type diffusion region 430 includes the second-type diffusion extension region 426, in which the dimension (b) indicates the overlap width of the second-type implant region 420 and the second-type diffusion extension region 426 on the source region (S) of the LNA transistor. In various aspects of the present disclosure, the second-type diffusion region 430 defines a fractional body terminal for the E-BTS device that is shorted to the source by a silicidation layer. Although the E-BTS LNA RF device 1200 of FIG. 12A is similar to the E-BTS LNA RF device 400 of FIG. 4, as further illustrated in a layout view 1250 of FIG. 12B, the E-BTS LNA RF device 1200 does not include the poly gate extension 440.

Figure 13A:
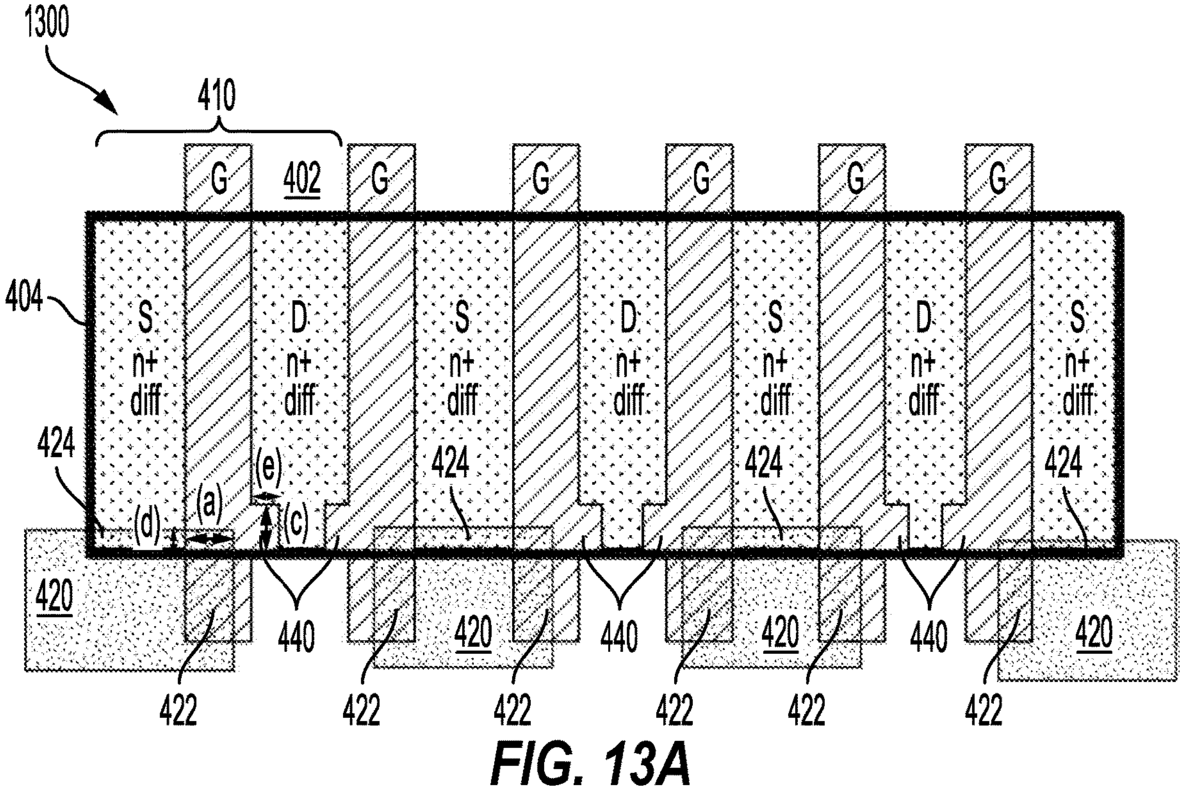
FIGS. 13A and 13B are schematic diagrams illustrating a top-down view and a layout view of an enhanced body tied to source (E-BTS) low noise amplifier (LNA) radio frequency (RF) device, according to various aspects of the present disclosure.
Figure 13B:
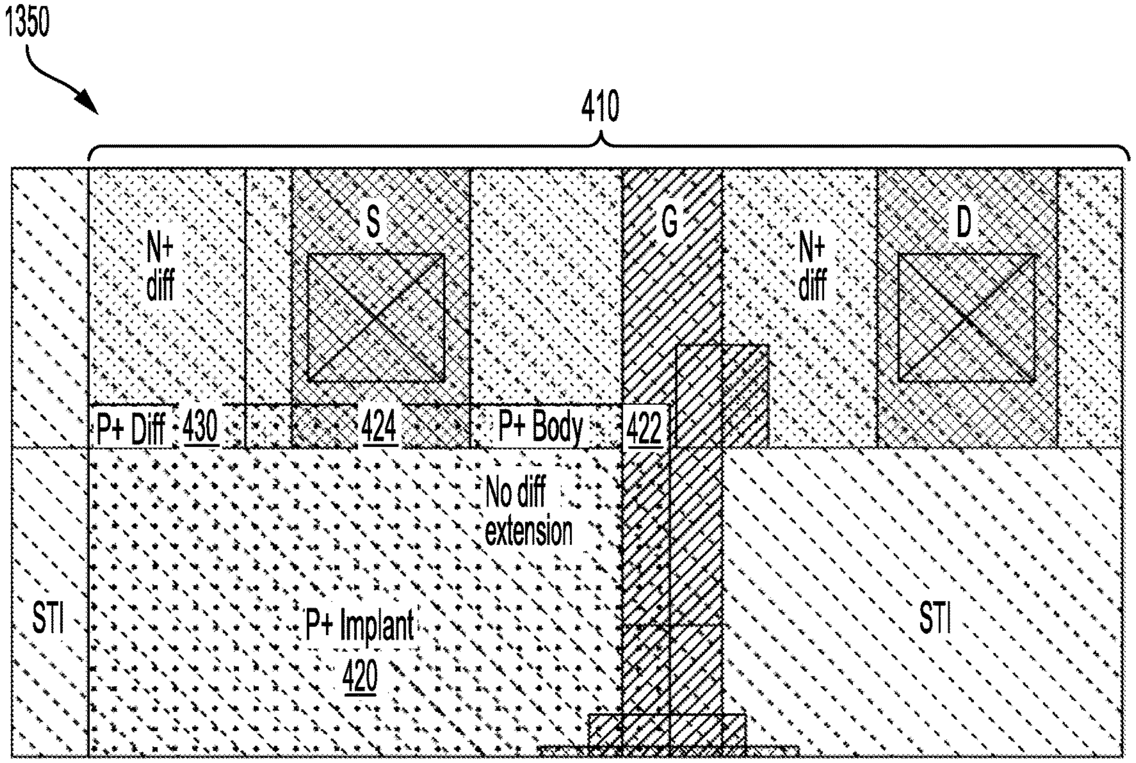

FIGS. 13A and 13B are schematic diagrams illustrating a top-down view and a layout view of an enhanced body tied to source (E-BTS) low noise amplifier (LNA) radio frequency (RF) device, according to various aspects of the present disclosure. FIG. 13A illustrates an E-BTS LNA RF device 1300 including the SOI substrate 402 having the first-type diffusion region 404 shown in FIG. 4. The E-BTS LNA RF device 1300 also includes the transistor 410 having the source region (S) and the drain region (D) in the first-type diffusion region 404 of the SOI substrate 402. The transistor 410 includes the gate region (G) between the source region (S) and the drain region (D), which includes a floating body region (not shown). In various aspects of the present disclosure the E-BTS LNA RF device 1300 includes the second-type implant region 420 partially overlapped by the gate region (G) and the source region (S) in the first-type diffusion region 404 to couple the floating body region of the transistor 410 to the source region (S).

According to various aspects of the present disclosure, the second-type diffusion region 430 includes the gate overlap region 422, in which the dimension (a) indicates the second-type diffusion region 430 overlap of the poly layer of the gate region (G), which may define a body region of the transistor underneath the gate region (G). Additionally, the second-type diffusion region 430 includes the second-type diffusion encroachment region 424, in which a dimension (d) indicates a width of the second-type diffusion encroachment region 424 inside the source region (S). In various aspects of the present disclosure, the second-type diffusion encroachment region 424 defines a fractional body terminal for the E-BTS device that is shorted to the source by silicidation. The poly gate extension 440 is also shown on the side of the drain region (D) to increase the gate length (Lg) of the gate region (G). Additionally, the second-type diffusion extension region 426 of the source region (S) is shown, according to the dimension (b). Although the e-BTS LNA RF device 1300 of FIG. 13A is similar to the e-BTS LNA RF device 400 of FIG. 4, as further illustrated in a layout view 1350 of 13B, the e-BTS LNA RF device 1300 does not includes the second-type diffusion extension region 426.

Figure 14:
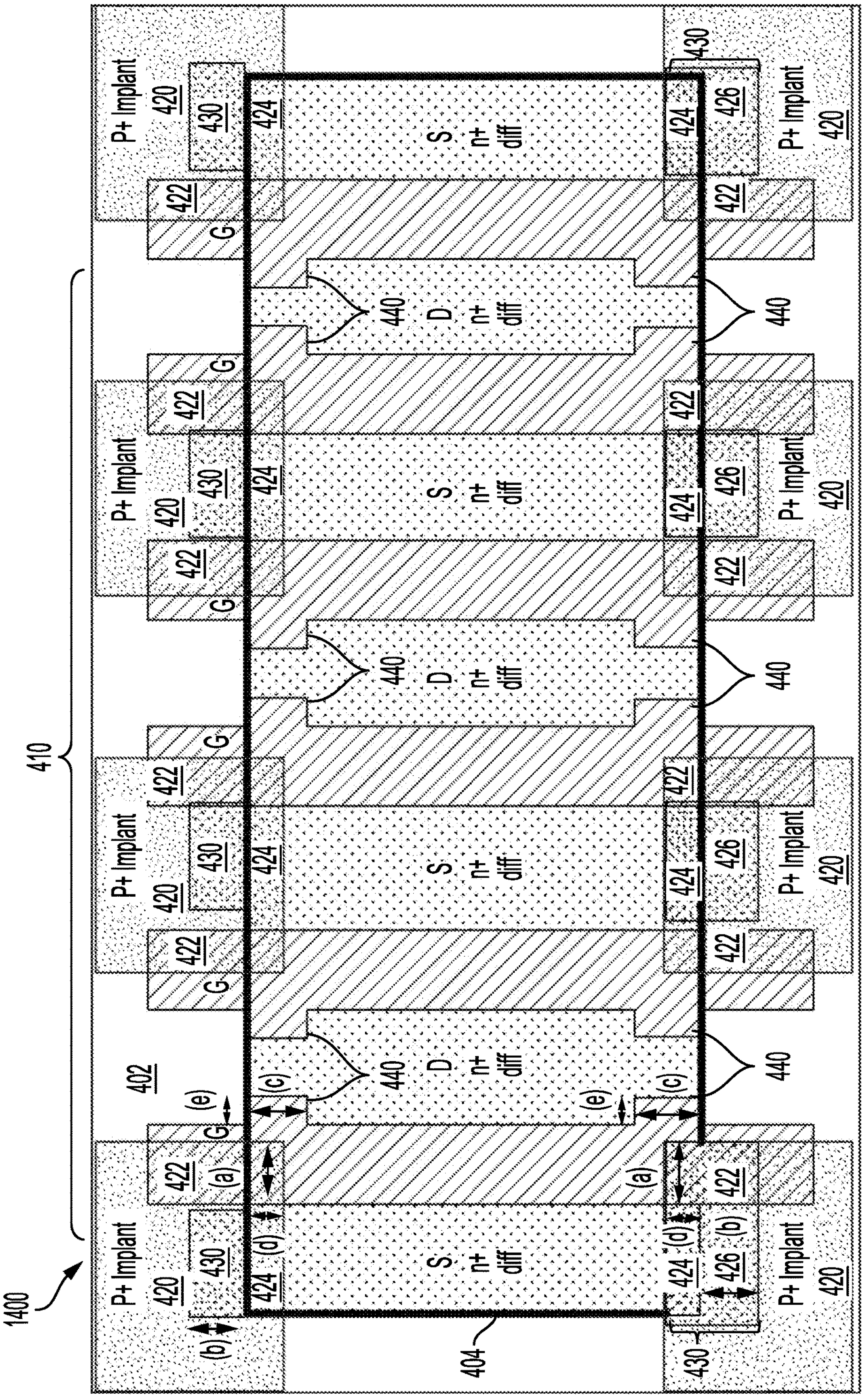
FIG. 14 is a schematic diagram illustrating a top-down view of an enhanced body tied to source (E-BTS) low noise amplifier (LNA) radio frequency (RF) device, according to various aspects of the present disclosure.

FIG. 14 is a schematic diagram illustrating a top-down view of an enhanced body tied to source (E-BTS) low noise amplifier (LNA) radio frequency (RF) device 1400, according to various aspects of the present disclosure. FIG. 14 illustrates the E-BTS LNA RF device 1400 including the SOI substrate 402 having the first-type diffusion region 404. The E-BTS LNA RF device 1400 also includes the transistor 410 having the source region (S) and the drain region (D) in the first-type diffusion region 404 of the SOI substrate 402. The transistor 410 includes the gate region (G) between the source region (S) and the drain region (D), which includes a floating body region (not shown). In various aspects of the present disclosure the E-BTS LNA RF device 1400 includes the second-type diffusion region 430 (e.g., P-type) partially overlapped by the gate region (G) and the source region (S) in the first-type diffusion region 404 to couple the body region of the transistor 410 to the source region (S).

According to various aspects of the present disclosure, the second-type diffusion region 430 includes the gate overlap region 422, in which the dimension (a) indicates the second-type implant region 420 overlap of the poly layer of the gate region (G), which may define a body region of the transistor underneath the gate region (G). Additionally, the second-type diffusion region 430 includes the second-type diffusion encroachment region 424, in which the dimension (d) indicates a width of the second-type diffusion encroachment region 424 inside the source region (S). The poly gate extension 440 is also shown on the side of the drain region (D) to increase the gate length (Lg) of the gate region (G). Additionally, the second-type diffusion extension region 426 on the source side(S) is shown, in which the dimension (b) indicates the extension of second-type diffusion region 430 shorted to the first-type diffusion region 404 only on the source side through a silicidation process.

Although the E-BTS LNA RF device 1400 of FIG. 14 is similar to the E-BTS LNA RF device 400 of FIG. 4, the E-BTS LNA RF device 1400 includes the gate overlap region 422, the second-type diffusion encroachment region 424, the second-type diffusion region 430, and the poly gate extension 440 on both opposing sides of the gate region (G). In various aspects of the present disclosure, the gate regions (G) of the E-BTS LNA RF device 1400 include a first poly gate extension at a first end of the gate regions in the first-type diffusion region 404, and a second poly gate extension at a second end opposite the first end of the gate regions (G) and in the first-type diffusion region 404. A method of constructing an E-BTS LNA RF device, according to various aspects of the present disclosure, is shown in FIG. 15.

Figure 15:
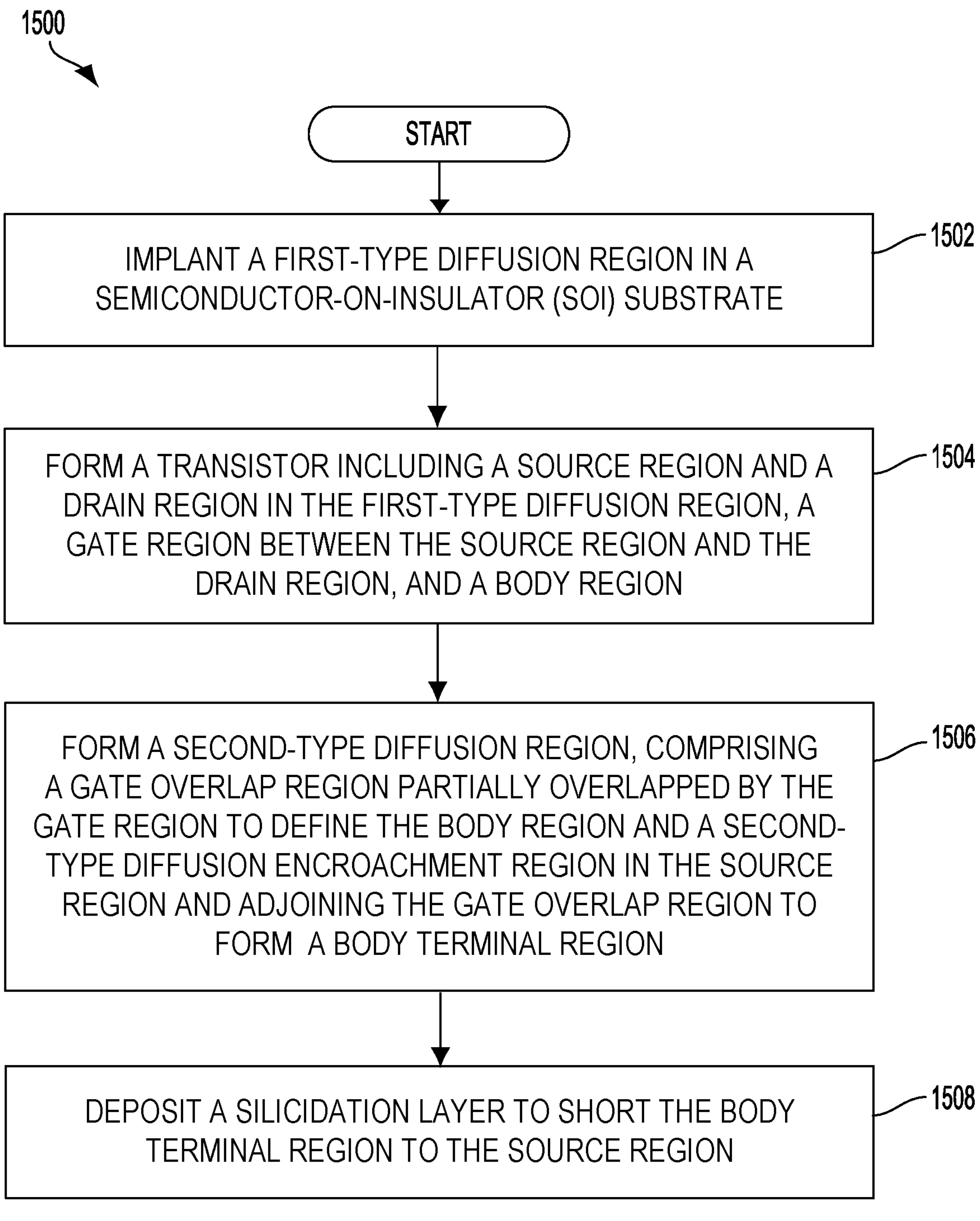
FIG. 15 is a process flow diagram illustrating a method for constructing a radio frequency (RF) device having a second-type implant to contact a floating body to a source region of a transistor, according to an aspect of the present disclosure.

FIG. 15 is a process flow diagram illustrating a method for constructing a radio frequency (RF) device having a second-type implant to contact a floating body to a source region of a transistor, according to an aspect of the present disclosure. A method 1500 begins at block 1502, in which a first-type diffusion region is implanted in a semiconductor-on-insulator (SOI) substrate. For example, as shown in FIG. 4, the e-BTS LNA RF device 400 includes a semiconductor-on-insulator (SOI) substrate 402 having a first-type diffusion region 404 (e.g., N-type).

At block 1504, a transistor is formed, including a source region and a drain region in the first-type diffusion region, a gate region between the source region and the drain region, and a floating body region. For example, as shown in FIG. 4, the e-BTS LNA RF device 400 also includes a transistor 410 having a source region (S) and a drain region (D) in the first-type diffusion region 404 of the SOI substrate 402. The transistor 410 includes a gate region (G) between the source region (S) and the drain region (D), which includes a floating body region (not shown).

At block 1506, a second-type diffusion region is formed, composed of a gate overlap region partially overlapped by the gate region to define the body region and a second-type diffusion encroachment region in the source region and adjoining the gate overlap region to form a body terminal region. For example, as shown in FIG. 4, the e-BTS LNA RF device 400 includes the second-type diffusion region 430 having a gate overlap region 422, in which a dimension (a) indicates the second-type implant region 420 (e.g., P+) overlap of a polysilicon (poly) layer of the gate region (G), which may define a body region of the transistor underneath the gate region (G), and which may be half of a minimum poly length, or the minimum defined mask overlap according to technology capabilities. Additionally, the second-type diffusion region 430 includes a second-type diffusion encroachment region 424, in which a dimension (d) indicates a width of the second-type diffusion encroachment region 424 inside the source region (S), which is less than three percent (<3%) of the total diffusion width of the first-type diffusion region 404.

At block 1508, a silicidation layer is deposited to short the body terminal region to the source region. For example, as shown in FIG. 9, the second-type diffusion region 430 (e.g., P+ Diff) is formed from a combination of the second-type diffusion extension region 426 and the second-type diffusion encroachment region 424, which is formed from an undoped region on the surface of the BOX 403 between the source region (S) and the STI region. In various aspects of the present disclosure, a silicidation layer 460 is deposited to short the diffusion region, including the second-type diffusion encroachment region 424 and the second-type diffusion extension region 426 to the first-type diffusion region 404 of the source region (S). Additionally, the M1 metal layer interconnect is shown with the M0 metal layer interconnect to the source region (S) of the transistor 410.

Figure 16:
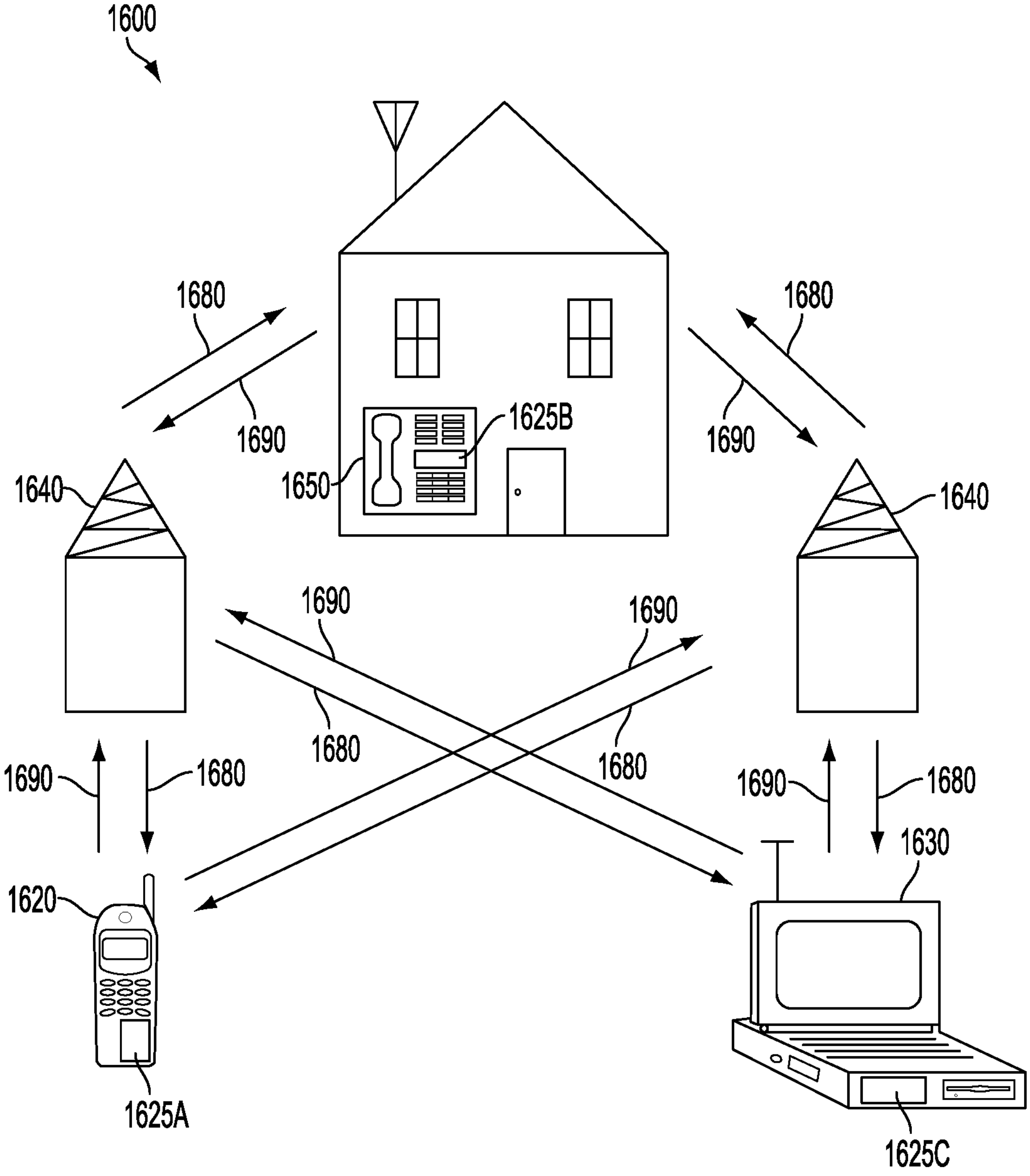
FIG. 16 is a block diagram showing an exemplary wireless communications system in which a configuration of the present disclosure may be advantageously employed.

FIG. 16 is a block diagram showing an exemplary wireless communications system 1600 in which an aspect of the present disclosure may be advantageously employed. For purposes of illustration, FIG. 16 shows three remote units 1620, 1630, and 1650 and two base stations 1640. It will be recognized that wireless communications systems may have many more remote units and base stations. Remote units 1620, 1630, and 1650 include IC devices 1625A, 1625C, and 1625B that include the disclosed enhanced body tied to source LNA device. It will be recognized that other devices may also include the disclosed enhanced body tied to source LNA device, such as the base stations, switching devices, and network equipment. FIG. 16 shows forward link signals 1680 from the base station 1640 to the remote units 1620, 1630, and 1650 and reverse link signals 1690 from the remote units 1620, 1630, and 1650 to base stations 1640.

In FIG. 16, remote unit 1620 is shown as a mobile telephone, remote unit 1630 is shown as a portable computer, and remote unit 1650 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 14 illustrates remote units, according to the aspects of the present disclosure, the present disclosure is not limited to these exemplary illustrated units. Aspects of the present disclosure may be suitably employed in many devices, which include the disclosed enhanced body tied to source LNA device.

Figure 17:
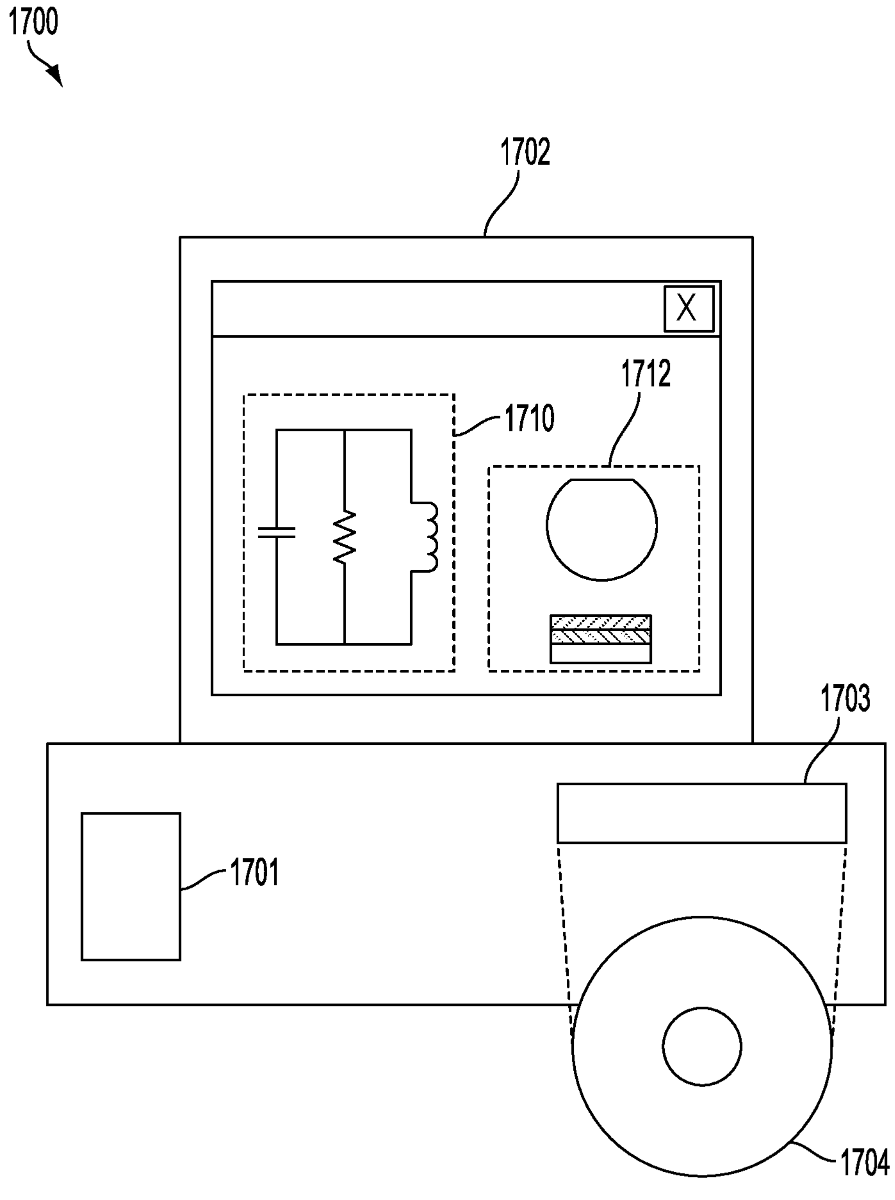
FIG. 17 is a block diagram illustrating a design workstation used for circuit, layout, and logic design of a semiconductor component, according to one configuration.

FIG. 17 is a block diagram illustrating a design workstation used for circuit, layout, and logic design of a semiconductor component, such as the switch field effect transistors (FETs) and enhanced body tied to source LNA device disclosed above. A design workstation 1700 includes a hard disk 1701 containing operating system software, support files, and design software such as Cadence or OrCAD. The design workstation 1700 also includes a display 1702 to facilitate a circuit design 1710 or an RFIC 1712. A storage medium 1704 is provided for tangibly storing the circuit design 1710 or the RFIC 1712. The circuit design 1710 or the RFIC 1712 may be stored on the storage medium 1704 in a file format such as GDSII or GERBER. The storage medium 1704 may be a CD-ROM, DVD, hard disk, flash memory, or other appropriate device. Furthermore, the design workstation 1700 includes a drive apparatus 1703 for accepting input from or writing output to the storage medium 1704.

Data recorded on the storage medium 1704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1704 facilitates the design of the circuit design 1710 or the RFIC 1712 by decreasing the number of processes for designing semiconductor wafers.

Implementation examples are described in the following numbered clauses:

1. A radio frequency (RF) device, comprising:
   - a semiconductor-on-insulator (SOI) substrate having a first-type diffusion region;
   - a transistor including a source region and a drain region in the first-type diffusion region, a gate region between the source region and the drain region, and a body region; and
   - a second-type diffusion region, comprising a gate overlap region partially overlapped by the gate region to define the body region and a second-type diffusion encroachment region in the source region and adjoining the gate overlap region to form a body terminal region, in which a silicidation layer shorts the body terminal region to the source region.

2. The RF device of clause 1, in which a width of the second-type diffusion encroachment region in the source region is less than a width of the first-type diffusion region in the source region.

3. The RF device of any of clauses 1 or 2, in which a dimension (d) indicates a width of the second-type diffusion encroachment region in the source region.

4. The RF device of any of clauses 1-3, in which the second-type diffusion region comprises a second-type diffusion extension region, and a dimension (b) indicates an extension of the second-type diffusion region on a side of the source region having a length greater than a length of the drain region and shorted to the source region by the silicidation layer.

5. The RF device of any of clauses 1-4, in which the gate region comprises a poly gate extension, a dimension (c) indicates a width of the poly gate extension on a side of the drain region, and a dimension (e) defines a length of the poly gate extension.

6. The RF device of any of clauses 1-5, in which the gate region comprises a first poly gate extension at a first end of the gate region in the first-type diffusion region, and a second poly gate extension at a second end of the gate region, opposite the first end of the gate region, in the first-type diffusion region.

7. The RF device of any of clauses 1-6, in which the first-type diffusion region comprises an N+ diffusion region.

8. The RF device of any of clauses 1-7, in which the second-type diffusion region comprises a P+ diffusion region.

9. The RF device of any of clauses 1-8, in which the RF device comprises an RF low noise amplifier (LNA) device.

10. The RF device of clause 9, in which the RF LNA device is integrated in a radio frequency (RF) front end module, the RF front end module incorporated in at least one of a music player, a video player, an entertainment unit, a navigation device, a communications device, a personal digital assistant (PDA), a fixed location data unit, a mobile phone, and a portable computer.

11. A method of constructing a radio frequency (RF) device, comprising:

implanting a first-type diffusion region in a semiconductor-on-insulator (SOI) substrate;

forming a transistor including a source region and a drain region in the first-type diffusion region, a gate region between the source region and the drain region, and a body region;

forming a second-type diffusion region, comprising a gate overlap region partially overlapped by the gate region to define the body region and a second-type diffusion encroachment region in the source region and adjoining the gate overlap region to form a body terminal region; and depositing a silicidation layer to short the body terminal region to the source region.

12. The method of clause 11, in which a width of the second-type diffusion encroachment region in the source region is less than a width of the first-type diffusion region in the source region.

13. The method of any of clauses 11 or 12, in which a dimension (d) indicates a width of the second-type diffusion encroachment region in the source region.

14. The method of any of clauses 11-13, in which the second-type diffusion region comprises a second-type diffusion extension region, and a dimension (b) indicates an extension of the second type diffusion region on a side of the source region having a length greater than a length of the drain region and shorted to the source region by the silicidation layer.

15. The method of any of clauses 11-14, in which the gate region comprises a poly gate extension, a dimension (c) indicates a width of the poly gate extension on a side of the drain region, and a dimension (e) defines a length of the poly gate extension.

16. The method of any of clauses 11-15, in which the gate region comprises a first poly gate extension at a first end of the gate region in the first-type diffusion region, and a second poly gate extension at a second end of the gate region, opposite the first end of the gate region, in the first-type diffusion region.

17. The method of any of clauses 11-16, in which the first-type diffusion region comprises an N+ diffusion region.

18. The method of any of clauses 11-17, in which the second-type diffusion region comprises a P+ diffusion region.

19. The method of any of clauses 11-18, in which the RF device comprises an RF low noise amplifier (LNA) device.

20. The method of clause 19, further comprising integrating the RF LNA device in a radio frequency (RF) front end module, the RF front end module incorporated in at least one of a music player, a video player, an entertainment unit, a navigation device, a communications device, a personal digital assistant (PDA), a fixed location data unit, a mobile phone, and a portable computer.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform the same function or achieve the same result as the corresponding configurations described herein may be utilized, according to the present disclosure. Accordingly, the appended claims are intended to include within their scope such processes, machines, manufacture, compositions of matter, means, methods, or steps.

What is claimed is:

1. A radio frequency (RF) device, comprising:

a semiconductor-on-insulator (SOI) substrate having a first-type diffusion region;

a transistor on the first-type diffusion region and comprising a source region, a drain region, a gate region between the source region and the drain region, and a body region; and a second-type diffusion region, comprising:

a gate overlap region partially overlapped by the gate region to define the body region; and a second-type diffusion encroachment region on the SOI substrate and extending in the source region, over a boundary at an edge of the first-type diffusion region orthogonal to a length of the gate region, and adjoining the gate overlap region to form a body terminal region, wherein the gate region comprises a poly gate extension on the drain region and within the first-type diffusion region, the poly gate extension having a boundary at the edge of the first-type diffusion region.

2. The RF device of claim 1, in which a width of the second-type diffusion encroachment region in the source region is less than a width of the first-type diffusion region in the source region.

3. The RF device of claim 1, in which a dimension (d) indicates a width of the second-type diffusion encroachment region in the source region.

4. The RF device of claim 1, in which the second-type diffusion region comprises a second-type diffusion extension region, and a dimension (b) indicates an extension of the second-type diffusion region on a side of the source region having a length greater than a length of the drain region and shorted to the source region by a silicidation layer.

5. The RF device of claim 1, in which the gate region comprises a first poly gate extension at a first end of the gate region in the first-type diffusion region, and a second poly gate extension at a second end of the gate region, opposite the first end of the gate region, in the first-type diffusion region.

6. The RF device of claim 1, in which the first-type diffusion region comprises an N+ diffusion region.

7. The RF device of claim 1, in which the second-type diffusion region comprises a P+ diffusion region.

8. The RF device of claim 1, in which the RF device comprises an RF low noise amplifier (LNA) device.

9. The RF device of claim 8, in which the RF LNA device is integrated in a radio frequency (RF) front end module, the RF front end module incorporated in at least one of a music player, a video player, an entertainment unit, a navigation device, a communications device, a personal digital assistant (PDA), a fixed location data unit, a mobile phone, and a portable computer.

10. A method of constructing a radio frequency (RF) device, comprising:

implanting a first-type diffusion region in a semiconductor-on-insulator (SOI) substrate;

forming a transistor including a source region and a drain region in the first-type diffusion region, a gate region between the source region and the drain region, and a body region;

forming a second-type diffusion region, comprising a gate overlap region partially overlapped by the gate region to define the body region and a second-type diffusion encroachment region on the SOI substrate and extending in the source region, over a boundary at an edge of the first-type diffusion region orthogonal to a length of the gate region, and adjoining the gate overlap region to form a body terminal region, wherein the gate region comprises a poly gate extension on the drain region and within the first-type diffusion region, the poly gate extension having a boundary at the edge of the first-type diffusion region; and depositing a silicidation layer to short the body terminal region to the source region.

11. The method of claim 10, in which a width of the second-type diffusion encroachment region in the source region is less than a width of the first-type diffusion region in the source region.

12. The method of claim 10, in which a dimension (d) indicates a width of the second-type diffusion encroachment region in the source region.

13. The method of claim 10, in which the second-type diffusion region comprises a second-type diffusion extension region, and a dimension (b) indicates an extension of the second-type diffusion region on a side of the source region having a length greater than a length of the drain region and shorted to the source region by the silicidation layer.

14. The method of claim 10, in which the gate region comprises a first poly gate extension at a first end of the gate region in the first-type diffusion region, and a second poly gate extension at a second end of the gate region, opposite the first end of the gate region, in the first-type diffusion region.

15. The method of claim 10, in which the first-type diffusion region comprises an N+ diffusion region.

16. The method of claim 10, in which the second-type diffusion region comprises a P+ diffusion region.

17. The method of claim 10, in which the RF device comprises an RF low noise amplifier (LNA) device.

18. The method of claim 17, further comprising integrating the RF LNA device in a radio frequency (RF) front end module, the RF front end module incorporated in at least one of a music player, a video player, an entertainment unit, a navigation device, a communications device, a personal digital assistant (PDA), a fixed location data unit, a mobile phone, and a portable computer.

* * * * *